United States Patent
Ra et al.

(10) Patent No.: US 11,508,318 B2
(45) Date of Patent: Nov. 22, 2022

(54) LIGHT EMITTING DISPLAY DEVICE

(71) Applicant: Samsung Display Co., LTD., Yongin-si (KR)

(72) Inventors: Yoo Mi Ra, Ansan-si (KR); Kyung-Ho Park, Hwaseong-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

(21) Appl. No.: 17/402,481

(22) Filed: Aug. 13, 2021

(65) Prior Publication Data
US 2022/0180818 A1  Jun. 9, 2022

(30) Foreign Application Priority Data
Dec. 3, 2020 (KR) .................. 10-2020-0167590

(51) Int. Cl.
*G09G 3/3291* (2016.01)

(52) U.S. Cl.
CPC ... *G09G 3/3291* (2013.01); *G09G 2300/0842* (2013.01); *G09G 2320/0233* (2013.01)

(58) Field of Classification Search
None
See application file for complete search history.

(56) References Cited

U.S. PATENT DOCUMENTS

| | | | | |
|---|---|---|---|---|
| 10,032,846 B2* | 7/2018 | Choi | .................. | H01L 27/1222 |
| 2012/0306841 A1* | 12/2012 | Toya | .................. | G09G 3/3291 |
| | | | | 345/212 |
| 2018/0277042 A1* | 9/2018 | Noh | .................. | G09G 3/3258 |
| 2019/0311675 A1* | 10/2019 | Yang | .................. | G09G 3/3283 |
| 2020/0194529 A1* | 6/2020 | Lee | .................. | H01L 27/3265 |
| 2021/0174739 A1* | 6/2021 | Lu | .................. | G09G 3/3225 |
| 2021/0335989 A1* | 10/2021 | Diao | .................. | H01L 27/3276 |
| 2021/0366379 A1* | 11/2021 | Xu | .................. | H01L 27/3265 |
| 2021/0407402 A1* | 12/2021 | Xu | .................. | G09G 3/3233 |
| 2022/0045141 A1* | 2/2022 | Zhang | .................. | G09G 3/3208 |
| 2022/0052147 A1* | 2/2022 | Liu | .................. | H01L 27/3265 |
| 2022/0157921 A1* | 5/2022 | Wang | .................. | H01L 27/3218 |

FOREIGN PATENT DOCUMENTS

| | | | |
|---|---|---|---|
| KR | 100570995 B1 | 4/2006 |
| KR | 101209948 B1 | 12/2012 |
| KR | 101319319 B1 | 10/2013 |
| KR | 102139972 B1 | 7/2020 |

* cited by examiner

*Primary Examiner* — Sepehr Azari
(74) *Attorney, Agent, or Firm* — Cantor Colburn LLP

(57) ABSTRACT

A light emitting display device includes: a first driving transistor; a first anode electrically connected to the first driving transistor; a first capacitor electrically connected to a gate electrode of the first driving transistor; a second driving transistor disposed to be adjacent to the first driving transistor; a second anode electrically connected to the second driving transistor; a second capacitor electrically connected to a gate electrode of the second driving transistor; a driving voltage line which applies a driving voltage to the first driving transistor and the second driving transistor; and a first connecting member electrically connecting the gate electrode of the first driving transistor and the first capacitor, where the driving voltage line is disposed between the first connecting member and the second anode in a plan view.

20 Claims, 18 Drawing Sheets

LIGHT EMITTING DISPLAY DEVICE

This application claims priority to Korean Patent Application No. 10-2020-0167590, filed on Dec. 3, 2020, and all the benefits accruing therefrom under 35 U.S.C. § 119, the content of which in its entirety is herein incorporated by reference.

BACKGROUND

1. Field

The disclosure relates to a light emitting display device, and more specifically, to a light emitting display device in which interference between adjacent pixels is reduced.

2. Description of the Related Art

A display device is a device for displaying an image, and typically includes a liquid crystal display ("LCD") panel, an organic light emitting diode ("OLED") display panel, and the like. The display device is widely used in various electronic devices such as a mobile phone, a navigation device, a digital camera, an electronic book, a portable game machine, and various terminals.

Since the OLED display has a self-luminance characteristic and does not use a separate light source, unlike the LCD, thickness and weight thereof may be reduced. In addition, the OLED display has various desired characteristics such as low power consumption, high luminance, and high response speed.

SUMMARY

Embodiments are to provide a light emitting display device in which interference between pixels is reduced to improve display quality.

An embodiment provides a light emitting display device including: a first driving transistor; a first anode electrically connected to the first driving transistor; a first capacitor electrically connected to a gate electrode of the first driving transistor; a second driving transistor disposed to be adjacent to the first driving transistor; a second anode electrically connected to the second driving transistor; a second capacitor electrically connected to a gate electrode of the second driving transistor; a driving voltage line which applies a driving voltage to the first driving transistor and the second driving transistor; and a first connecting member electrically connecting the gate electrode of the first driving transistor and the first capacitor, where the driving voltage line may be disposed between the first connecting member and the second anode in a plan view.

In an embodiment, the first connecting member, the first anode, and the driving voltage line may not overlap each other in the plan view.

In an embodiment, each of the first capacitor and the second capacitor may include: a lower storage electrode disposed in a first conductive layer disposed on the substrate; a first insulating layer disposed on the lower storage electrode; and an expansion part disposed in a semiconductor layer disposed on the first insulating layer.

In an embodiment, each of the first driving transistor and the second driving transistor may include: a first semiconductor disposed in the semiconductor layer; a second insulating layer disposed on the semiconductor layer; and a gate electrode disposed in a second conductive layer disposed on the second insulating layer.

In an embodiment, a third insulating layer may be disposed on the second conductive layer, a third conductive layer may be disposed on the third insulating layer, and the first connecting member, the first anode, and the driving voltage line may be disposed in the third conductive layer.

In an embodiment, the driving voltage line may be a second driving voltage line extending in a first direction, and the light emitting display device may further include a first driving voltage line which is electrically connected to the second driving voltage line and extends in a second direction perpendicular to the first direction.

In an embodiment, the light emitting display device may further include a connecting part which connects the second driving voltage line and the first driving voltage line to each other and is disposed in the third conductive layer, where the connecting part may be connected to a semiconductor of the driving transistor, and the connecting part may be integrally formed with the second driving voltage line as a single unitary unit.

In an embodiment, the first driving voltage line may be disposed in the first conductive layer, and the light emitting display device may further include a first auxiliary driving voltage line which is electrically connected to the first driving voltage line and is formed long along the first driving voltage line.

In an embodiment, the light emitting display device may further include: a first input transistor which transmits a data voltage to the gate electrode of the first driving transistor; and a first initialization transistor which transmits an initialization voltage to the first anode, where the first anode may be electrically connected to the lower storage electrode and the first initialization transistor.

In an embodiment, the light emitting display device may further include: a third driving transistor disposed to be adjacent to the second driving transistor; a third anode electrically connected to the third driving transistor; a third capacitor electrically connected to a gate electrode of the third driving transistor; a cathode which collectively define a light emitting diode with the first anode, the second anode, and the third anode; a common voltage line which transmits a common voltage to the cathode; and a second connecting member electrically connecting the gate electrode of the second driving transistor and the second capacitor, where the common voltage line may be disposed between the second connecting member and the third anode in the plan view.

In an embodiment, the second connecting member, the third anode, and the common voltage line may not overlap each other in the plan view.

An embodiment provides a light emitting display device including: a first driving transistor; a first anode electrically connected to the first driving transistor; a first capacitor electrically connected to a gate electrode of the first driving transistor; a second driving transistor disposed to be adjacent to the first driving transistor; a second anode electrically connected to the second driving transistor; a second capacitor electrically connected to a gate electrode of the second driving transistor; a cathode which collectively define a light emitting diode with the first anode and the second anode; a common voltage line which transmits a common voltage to the cathode; and a first connecting member electrically connecting the gate electrode of the first driving transistor and the first capacitor, where the common voltage line may be disposed between the first connecting member and the second anode in a plan view.

In an embodiment, the first connecting member, the first anode, and the common voltage line may not overlap each other in the plan view.

In an embodiment, the first capacitor and the second capacitor may include: a lower storage electrode disposed in a first conductive layer disposed on the substrate; a first insulating layer disposed on the lower storage electrode; and an expansion part disposed in a semiconductor layer disposed on the first insulating layer.

In an embodiment, each of the first driving transistor and the second driving transistor may include: a first semiconductor disposed in the semiconductor layer; a second insulating layer disposed on the semiconductor layer; and a gate electrode disposed in a second conductive layer disposed on the second insulating layer.

In an embodiment, a third insulating layer may be disposed on the second conductive layer, a third conductive layer may be disposed on the third insulating layer, and the first connecting member, the first anode and the common voltage line may be disposed in the third conductive layer.

In an embodiment, the common voltage line may be a second common voltage line extending in a first direction, and the light emitting display device may further include a first common voltage line which is electrically connected to the second common voltage line and extends in a second direction perpendicular to the first direction.

In an embodiment, the first common voltage line may be formed in the first conductive layer, and the light emitting display device may further include a first auxiliary common voltage line which is electrically connected to the first common voltage line and extends along the first common voltage line.

In an embodiment, the second common voltage line may further include a connecting part extending in the second direction, an expansion part may be defined by a widely extended end portion of the connecting part, and the second common voltage line may be electrically connected to the cathode through the expansion part.

In an embodiment, the light emitting display device may further include: a first input transistor which transmits a data voltage to the gate electrode of the first driving transistor; and a first initialization transistor which transmits an initialization voltage to the first anode, wherein the first anode may be electrically connected to the lower storage electrode and the first initialization transistor.

According to embodiments of the invention, a voltage line to which a constant voltage is applied is disposed between an anode of one pixel and a connecting part directly connected to a gate electrode of a driving transistor of an adjacent pixel, so that the anodes of two adjacent pixels and the gate electrode of the driving transistor do not interfere with each other. As a result, a voltage of the gate electrode of the driving transistor may be charged up to a target voltage and not changed, so that a light emitting diode may display a target luminance.

DETAILED DESCRIPTION

Figure 1:
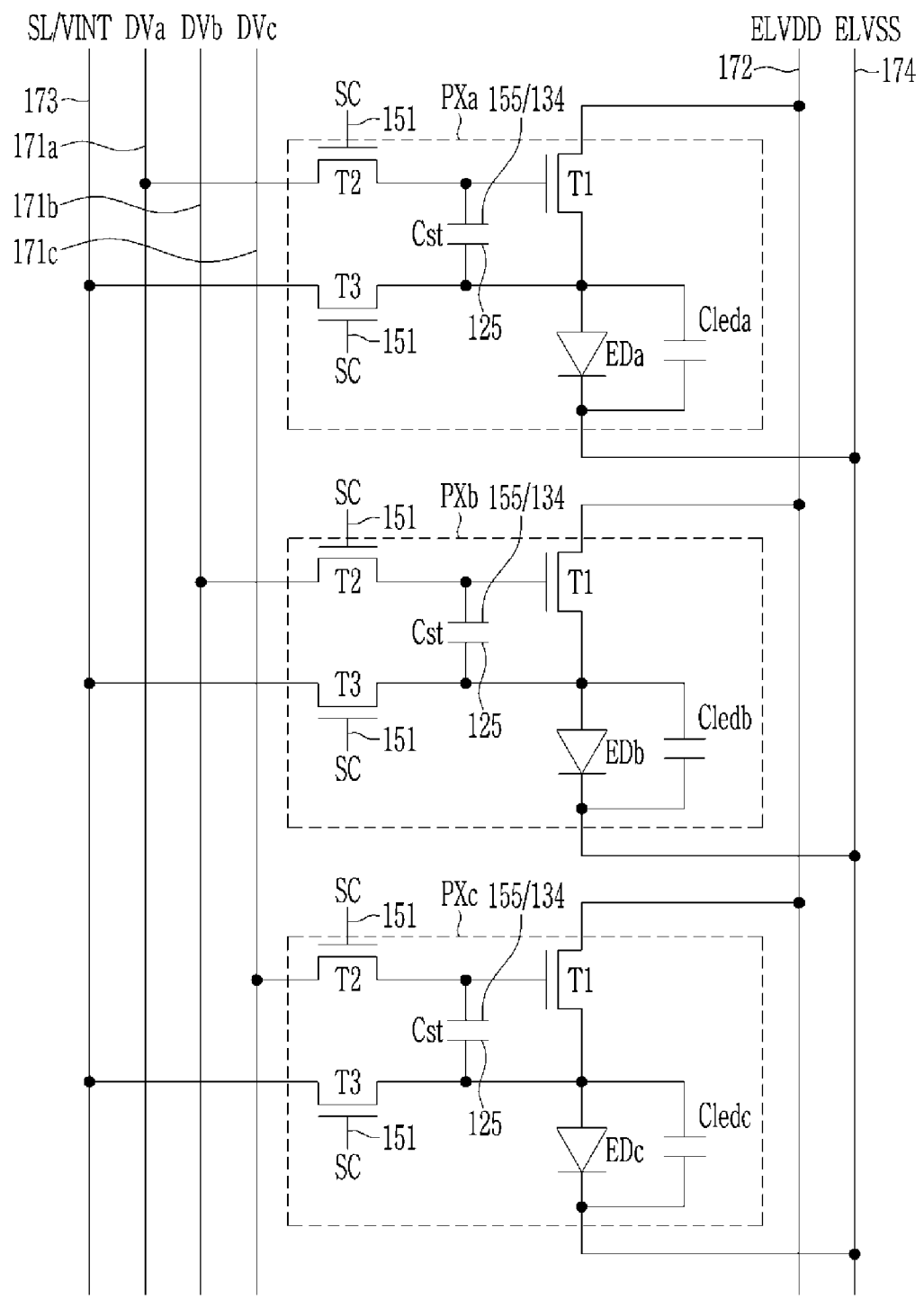
FIG. 1 illustrates a circuit diagram of a pixel of a light emitting display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, in the drawings, the size and thickness of each element are arbitrarily illustrated for ease of description, and the disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Throughout the specification, "connected" does not mean only when two or more elements are directly connected, but when two or more elements are indirectly connected through other elements, and when they are physically connected or electrically connected, and further, it may be referred to by different names depending on a position or function, and may also be referred to as a case in which respective parts that are substantially integrated are linked to each other.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a light emitting display device will be described in detail with reference to the accompanying drawings.

FIG. 1 illustrates a circuit diagram of a pixel of a light emitting display device according to an embodiment.

An embodiment of a light emitting display device includes a plurality of pixels, and FIG. 1 shows three adjacent pixels among the plurality of pixels.

In an embodiment, as shown in FIG. 1, the plurality of pixels may include a first pixel PXa, a second pixel PXb, and a third pixel PXc. Each of the first pixel PXa, the second pixel PXb, and the third pixel PXc includes a plurality of transistors T1, T2, and T3, a storage capacitor Cst, and a light emitting element, e.g., a light emitting diode EDa, EDb or EDc. In an embodiment, another capacitor Cleda, Cledb or Cledc (hereinafter referred to as a light emitting part capacitor) connected to an end of the light emitting diode EDa, EDb, or EDc may be further included in each of the first pixel PXa, the second pixel PXb, and the third pixel PXc.

The plurality of transistors T1, T2, and T3 include one driving transistor T1 (also referred to as a first transistor) and two switching transistors T2 and T3, and the two switching transistors are classified into an input transistor T2 (also referred to as a second transistor) and an initialization transistor T3 (also referred to as a third transistor). Each of the transistors T1, T2, and T3 includes a gate electrode, a first electrode, and a second electrode, and includes a semiconductor layer, and a current flows in or does not flow in the semiconductor layer based on a voltage of the gate electrode. Here, depending on voltages applied to respective transistors T1, T2, and T3, one of the first electrode and the second electrode may be a source electrode, and the other thereof may be a drain electrode.

In an embodiment, as shown in FIG. 1, the gate electrode of the driving transistor T1 is connected to one end of the storage capacitor Cst, and is also connected to the second electrode (output side electrode) of the input transistor T2. In such an embodiment, the first electrode of the driving transistor T1 is connected to a driving voltage line 172 that transmits a driving voltage ELVDD, and the second electrode of the driving transistor T1 is connected to the anode of the light emitting diode EDa, EDb, or EDc and to the other end of the storage capacitor Cst. The gate electrode of the driving transistor T1 receives a data voltage DVa, DVb, or DVc based on a switching operation of the input transistor T2, and a driving current may be supplied to the light emitting diode EDa, EDb, or EDc based on the voltage of the gate electrode of the driving transistor T1. In such an embodiment, the storage capacitor Cst stores and maintains the voltage of the gate electrode of the driving transistor T1.

The gate electrode of the input transistor T2 is connected to a first scan line 151 that transmits a first scan signal SC. The first electrode of the input transistor T2 is connected to a data line that may transmit the data voltage DVa, DVb, or DVc, and the second electrode of the input transistor T2 is connected to one end of the storage capacitor Cst and the gate electrode of the driving transistor T1. A plurality of data lines 171a, 171b, and 171c transmit different data voltages DVa, DVb, and DVc, respectively, and the input transistors T2 of the pixels PXa, PXb, and PXc are connected to different data lines, respectively. Therefore, the gate electrodes of the input transistors T2 of the pixels PXa, PXb, and PXc may be connected to a same first scan line 151 to receive a first scan signal SC at a same timing. In such an embodiment, the input transistors T2 of respective pixels PXa, PXb, and PXc may be simultaneously turned on by receiving the first scan signal SC at the same timing to transmit the data voltages DVa, DVb, and DVc to the gate electrodes of the driving transistors T1 and to one end of the storage capacitors Cst of respective pixels PXa, PXb, and PXc.

The gate electrode of the initialization transistor T3 is connected to the first scan line 151 that transmits the first scan signal SC. The first electrode of the initialization transistor T3 is connected to the other end of the storage capacitor Cst, the second electrode of the driving transistor T1, and the anode of the light emitting diode EDa, EDb, or EDc, and the second electrode of the initialization transistor T3 is connected to an initialization voltage line 173 that transmits an initialization voltage VINT. Here, the initialization voltage line 173 performs an operation to sense a voltage of the anode of the light emitting diode EDa, EDb, or EDc before applying the initialization voltage VINT, so that the initialization voltage line 173 may serve as a sensing wire SL. Through a sensing operation via the initialization voltage line 173 or the sensing wire SL, it may be checked whether the anode voltage is maintained at a target voltage. The sensing operation and the initialization operation of transmitting the initialization voltage VINT may be performed separately in time, and for example, the initialization operation is performed after the sensing operation is performed.

The initialization transistor T3 is turned on along with the input transistor T2 in response to the first scan signal SC, and the initialization transistor T3 performs the sensing operation and then finally transmits the initialization voltage VINT to the anode of the light emitting diode EDa, EDb, or EDc and the other end of the storage capacitor Cst to initialize the voltage of the anode of the light emitting diode EDa, EDb, or EDc. In an embodiment, the sensing operation may be omitted, or the sensing operation may be performed per a plurality of frames or every several frames.

One end of the storage capacitor Cst is connected to the gate electrode of the driving transistor T1 and the second electrode of the input transistor T2, and the other end thereof is connected to the first electrode of the initialization transistor T3 and the anode of the light emitting diode EDa, EDb, or EDc. In FIG. 1, one end and the other end of the storage capacitor Cst are labeled with reference numerals, to clearly indicate which part corresponds to the storage capacitor Cst in FIG. 2. In an embodiment, one end of the storage capacitor Cst may be defined by a gate electrode 155 of the driving transistor T1 and the expansion part 134 of a semiconductor layer connected thereto, and the other end of the storage capacitor Cst may be defined by a lower storage electrode 125. A main portion of the storage capacitor Cst may be formed in or defined by the expansion part 134 of the semiconductor layer, the lower storage electrode 125, and an insulating layer therebetween.

The cathode of the light emitting diode EDa, EDb, or EDc is connected to a common voltage line 174 that transmits a common voltage ELVSS. The light emitting diode EDa, EDb, or EDc emits light with luminance corresponding to an output current of the driving transistor T1 to display a grayscale.

In an embodiment, the light emitting part capacitors Cleda, Cledb, and Cledc are formed at respective ends of the light emitting diodes EDa, EDb, and EDc, so that voltages at respective ends of the light emitting diodes EDa, EDb, and EDc may be maintained constant so that the light emitting diodes EDa, EDb, and EDc may display a constant luminance.

Hereinafter, an operation of a pixel having the circuit as shown in FIG. 1 will be briefly described.

FIG. 1 illustrates an embodiment in which each transistor T1, T2, or T3 is an N-type transistor, and each transistor T1, T2, or T3 is turned on when a high level voltage is applied to the gate electrode thereof. However, in an alternative embodiment, each transistor T1, T2, or T3 may be a P-type transistor.

In an embodiment, one frame starts when an emission period ends. After the emission period ends, a high level first scan signal SC is supplied to the input transistor T2 and the initialization transistor T3 to be turned on.

When the input transistor T2 is turned on, a writing operation is performed. That is, the data voltage DVa, DVb, or DVc from the data line through the turned-on input transistor T2 is inputted and stored to the gate electrode of the driving transistor T1 and one end of the storage capacitor Cst.

In such an embodiment, when the initialization transistor T3 is turned on, the sensing operation and the initialization operation may be performed. First, through the sensing operation, it is sensed whether the voltage at the other end of the anode of the light emitting diode EDa, EDb, or EDc is the target voltage through the initialization voltage line 173. After the sensing operation, the initialization voltage VINT is transmitted to the initialization voltage line 173, so that the voltages of the other end of the storage capacitor Cst, the second electrode of the driving transistor T1, and the anode of the light emitting diode EDa, EDb, or EDc are changed to the initialization voltage VINT, thereby performing the initialization operation.

The data voltage DVa, DVb, or DVc and the initialization voltage VINT are applied to respective ends of the storage capacitor Cst, respectively. In the state in which the initialization transistor T3 is turned on, even if an output current is generated from the driving transistor T1, it may be outputted to the outside through the initialization transistor T3 and the initialization voltage line 173, so that it may not be inputted to the light emitting diode EDa, EDb, or EDc. In an embodiment, during the writing period in which the high level first scan signal SC is supplied, the driving voltage ELVDD is applied as a low level voltage, or the common voltage ELVSS is applied as a high level voltage, so that it is possible to prevent a current from flowing through the light emitting diode EDa, EDb, or EDc.

Thereafter, when the first scan signal SC is changed to a low level, since the driving voltage ELVDD having a normal high level and the common voltage ELVSS having a normal low level are applied to the pixel, a light emitting period in which the driving transistor T1 generates an output current by the gate voltage of the driving transistor T1 stored in the storage capacitor Cst, and the output current flows through the light emitting diodes EDa, EDb, or EDc to emit light, proceeds.

Hereinafter, a pixel structure of a light emitting display device according to an embodiment will be described in detail with reference to FIG. 2 and FIG. 3.

Figure 2:
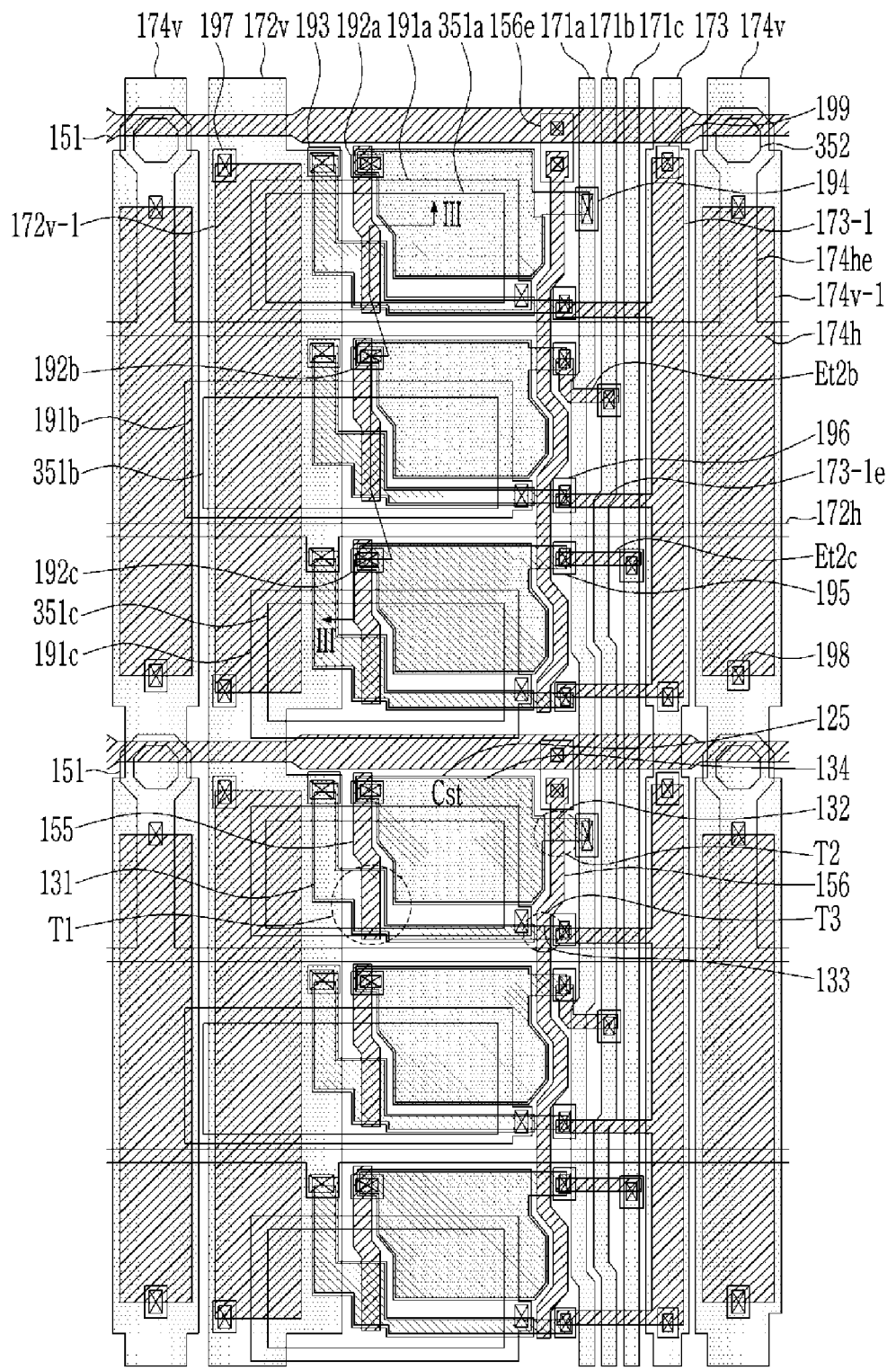
FIG. 2 illustrates a top plan view of a portion of a light emitting display device according to an embodiment.
Figure 3:
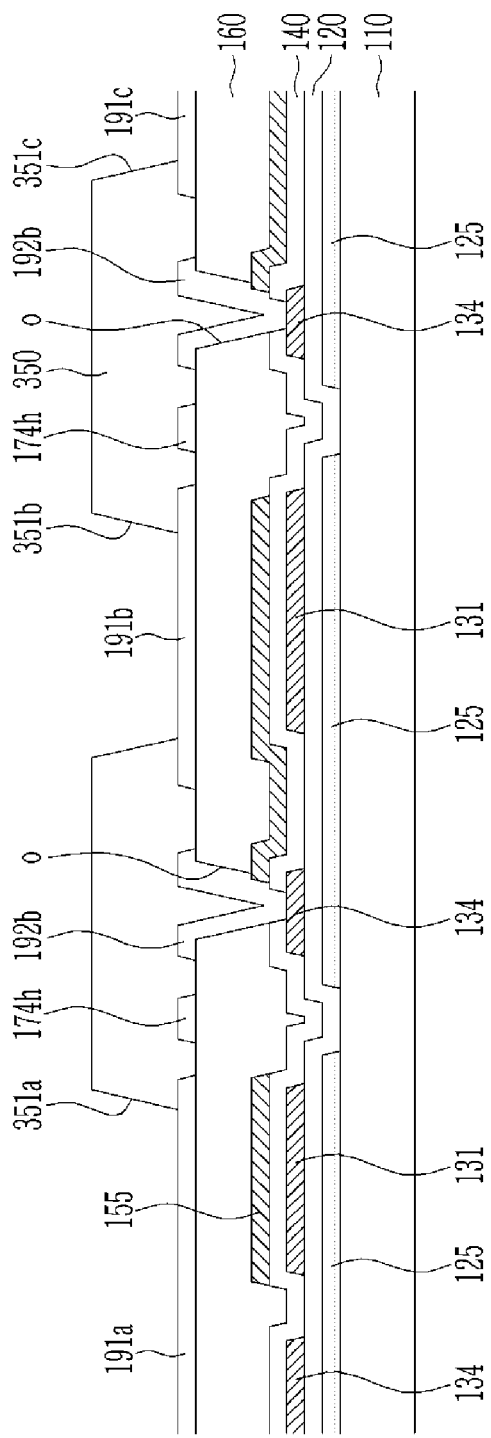
FIG. 3 illustrates a cross-sectional view of a light emitting display device taken along line III-III of FIG. 2.

FIG. 2 illustrates a top plan view of a portion of a light emitting display device according to an embodiment, and FIG. 3 illustrates a cross-sectional view of a light emitting display device taken along line III-III of FIG. 2.

In an embodiment, a pixel may include the light emitting diodes EDa, EDb, or EDc and a pixel circuit part, and the pixel circuit part may include the plurality of transistors T1, T2, and T3 and the storage capacitor Cst described above with reference to FIG. 1. In an embodiment, as described above with reference to FIG. 1, the pixel also includes the light emitting part capacitor Cleda, Cledb, or Cledc. For convenience of illustration and description, FIG. 2 and FIG.

3 illustrate only the pixel circuit part including the plurality of transistors T1, T2, and T3 and the storage capacitor Cst, and only the anode of the light emitting diode EDa, EDb, or EDc, of the above-described pixel.

First, a stacked structure of the light emitting display device will be schematically described with reference to FIG. 3.

An embodiment of the light emitting display device may include a substrate (or a first or lower substrate) 110. The substrate 110 may include an insulating material such as glass, plastic, or the like, and may have flexibility.

In such an embodiment, a first conductive layer, a first insulating layer 120, a semiconductor layer, a second insulating layer 140, a second conductive layer, a third insulating layer 160, a third conductive layer, and a fourth insulating layer 350 are sequentially disposed or formed on the substrate 110. In such an embodiment, the first insulating layer 120 and the second insulating layer 140 may be inorganic insulating layers including an inorganic insulating material, and the third insulating layer 160 and the fourth insulating layer 350 may be organic insulating layers including an organic insulating material. In an embodiment, each insulating layer may have a multilayer structure or be formed as a plurality of layers. In an embodiment, the first insulating layer 120 and the second insulating layer 140 may be organic insulating layers, or the third insulating layer 160 may be an inorganic insulating layer. Herein, the inorganic insulating material may include at least one selected from a silicon nitride (SiNx), a silicon oxide (SiOx), and a silicon oxynitride (SiON), and the organic insulating material may include at least one selected from polyimide, an acryl-based polymer, a siloxane-based polymer, and the like. In an embodiment, the first conductive layer, the second conductive layer, and the third conductive layer may include at least one selected from copper (Cu), aluminum (Al), magnesium (Mg), silver (Ag), gold (Au), platinum (Pt), palladium (Pd), nickel, (Ni), neodymium Nd, iridium (Ir), molybdenum (Mo), tungsten (W), titanium (Ti), chromium (Cr), tantalum (Ta), and an alloy thereof. Each of the first conductive layer, the second conductive layer, and the third conductive layer may be formed as a single layer or a multilayer. In one embodiment, for example, each of the first conductive layer, the second conductive layer, and the third conductive layer may have a multilayer structure including a lower layer including titanium and an upper layer including copper. In an embodiment, a transparent conductive material may be included in each of the first conductive layer, the second conductive layer, and the third conductive layer. In an embodiment, the semiconductor layer may include a semiconductor material such as amorphous silicon, polysilicon, or an oxide semiconductor. Hereinafter, embodiments where a semiconductor layer includes an oxide semiconductor will be mainly described.

In an embodiment, as shown in FIG. 2, the first scan line 151 has a structure that extends in a first direction (hereinafter, also referred to as a horizontal direction) from the second conductive layer, and is provided or formed per three pixel rows. The first scan line 151 has a structure that is electrically connected to a connecting part 156e disposed on a third conductive layer through an opening, and the connecting part 156e is electrically connected to a gate electrode 156 through the opening. The first scan line 151 controls the input transistor T2 and the initialization transistor T3 included in the three pixel rows with one first scan line 151 through the electrically connected gate electrode 156.

Data lines 171a, 171b, and 171c extend in a second direction (hereinafter, also referred to as a vertical direction) perpendicular to the first direction (horizontal direction) in the first conductive layer, and three data lines 171a, 171b, and 171c are provided or formed in one pixel column. The first data line 171a, which is electrically connected to the first pixel PXa, is electrically connected to the second semiconductor 132 through a connecting part 194 disposed in (or defined by a portion of) the third conductive layer and an opening. In an embodiment, the second data line 171b and the third data line 171c, which are electrically connected to the second pixel PXb and the third pixel PXc, respectively, further include additional connecting parts Et2b and Et2c to be electrically connected to a second semiconductor 132. In such an embodiment, the data lines 171b and 171c are connected to the additional connect parts Et2b and Et2c through the connecting part 194 disposed in the third conductive layer and the opening, respectively, and the additional connecting parts Et2b and Et2c are respectively electrically connected to the second semiconductor 132 through a connecting part 195 and the opening.

Through the above-described structure, even if only one first scan line 151 is connected to the three adjacent pixels PXa, PXb, and PXc disposed in one column, different data voltages DVa, DVb, and DVc may be applied through different data lines 171a, 171b, and 171c. Accordingly, the light emitting diodes EDa, EDb, and EDc respectively included in the pixels PXa, PXb, and PXc may display different luminance.

In an embodiment, the driving voltage line 172 that transmits the driving voltage ELVDD includes a first driving voltage line 172v, a first auxiliary driving voltage line 172v-1, and a second driving voltage line 172h. The first driving voltage line 172v is disposed in the first conductive layer, and extends in the second direction (vertical direction). The first auxiliary driving voltage line 172v-1 is disposed in the second conductive layer, and a plurality of first auxiliary driving voltage lines 172v-1 extends and linearly arranged in the second direction. The first auxiliary driving voltage line 172v-1 is electrically connected to the first driving voltage line 172v through an opening and a connecting part 197, so that the driving voltage ELVDD is transmitted through a double-layer (the first driving voltage line 172v and the first auxiliary driving voltage line 172v-1). In such an embodiment, the second driving voltage line 172h is disposed in the third conductive layer, and extends in the first direction (horizontal direction). The second driving voltage line 172h is electrically connected to the first driving voltage line 172v through an opening, so that the driving voltage ELVDD is also transmitted in the horizontal direction. In an embodiment, the opening and the connecting part 193 connecting the second driving voltage line 172h and the first driving voltage line 172v to each other may be the same as the opening and the connecting part 193 connecting the first driving voltage line 172v and the first semiconductor 131 to each other in the third pixel PXc. According to an embodiment having the structure of the driving voltage line 172 as described above, there is an effect of lowering resistance of the wire, so that the voltage level of the driving voltage ELVDD of the light emitting display device is not lowered as a whole. In an alternative embodiment, the first auxiliary driving voltage line 172v-1 may be omitted.

In an embodiment, the initialization voltage line 173 that transmits the initialization voltage VINT is disposed in the first conductive layer, and extends in the second direction (vertical direction). In an embodiment, the initialization voltage line 173 additionally includes a first auxiliary initialization voltage line 173-1. The first auxiliary initialization voltage line 173-1 is disposed in the second conductive layer, and a plurality of first auxiliary initialization voltage lines 173-1 extends and linearly arranged in the second direction. The first auxiliary initialization voltage line 173-1 is electrically connected to the initialization voltage line 173 through an opening and a connecting part 199, so that the initialization voltage VINT is transmitted through a double layer (the initialization voltage line 173 and the first auxiliary initialization voltage line 173-1), thereby lowering the resistance of the wire. In an embodiment, the first auxiliary initialization voltage line 173-1 includes a connecting part 173-1e extending in the first direction, and the first auxiliary initialization voltage line 173-1 is electrically connected to a third semiconductor 133 of the third transistor T3 through the connecting part 173-1e.

In an embodiment, the common voltage line 174 that transmits the common voltage ELVSS to the cathode of the light emitting diode EDa, EDb, or EDc includes a first common voltage line 174v, a first auxiliary common voltage line 174v-1, and a second common voltage line 174h. The first common voltage line 174v is disposed in the first conductive layer, and extends in the second direction (vertical direction). The first auxiliary common voltage line 174v-1 is disposed in the second conductive layer, and a plurality of first auxiliary common voltage lines 174v-1 are formed long in the second direction. The first auxiliary common voltage line 174v-1 is electrically connected to the first common voltage line 174v through an opening and a connecting part 198, so that the common voltage ELVSS is transmitted through a double layer (the first common voltage line 174v and the first auxiliary common voltage line 174v-1). In an embodiment, the second common voltage line 174h is disposed in the third conductive layer, and extends in the first direction (horizontal direction). The second common voltage line 174h further includes a connecting part 174he extending in the second direction. The connecting part 174he of the second common voltage line 174h further includes an expansion part that extends in the second direction and then widely extends. The expansion part is a part that is electrically connected to the cathode by an opening 352 defined or formed in the fourth insulating layer 350. The second common voltage line 174h is electrically connected to the first common voltage line 174v through the opening, so that the common voltage ELVSS is transmitted in the horizontal direction. In an embodiment, the opening for connecting the second common voltage line 174h and the first common voltage line 174v to each other is disposed to overlap the connecting part 174he, such that the second common voltage line 174h and the first common voltage line 174v are also electrically connected to the first auxiliary common voltage line 174v-1 through the opening. According to an embodiment having the structure of the common voltage line 174 as described above, there is an effect of lowering resistance of the wire, so that the voltage level of the common voltage ELVSS of the light emitting display device is not lowered as a whole. In an alternative embodiment, the first auxiliary common voltage line 174v-1 may be omitted.

The plurality of transistors T1, T2, and T3 have a same stacked structure as each other, and include a gate electrode disposed in the second conductive layer, a channel disposed on the semiconductor layer, and a first area and a second area disposed on opposing sides of the channel. Here, the first area and the second area disposed on the semiconductor layer may correspond to the first electrode and the second electrode of FIG. 1.

Each transistor will hereinafter be described in detail.

In an embodiment, as shown in FIG. 3, the driving transistor T1 has a channel, a first area, and a second area in the first semiconductor 131 disposed on the first insulating layer 120, and the first area and the second area are doped to have a same or similar conductive characteristics as a conductor. In an embodiment, as shown in FIG. 2, the first area of the first semiconductor 131 is electrically connected to the first driving voltage line 172v through the opening and the connecting part 193 to receive the driving voltage ELVDD. The second area of the first semiconductor 131 may be connected directly to the first area of the third semiconductor 133. In an embodiment, the second area of the first semiconductor 131 is electrically connected to the anodes 191a, 191b, and 191c disposed in the third conductive layer through the opening, and to the lower storage electrode 125 disposed in the first conductive layer. The first semiconductor 131 is covered by the second insulating layer 140, and the gate electrode 155 is disposed on the second insulating layer 140. In a plan view, a channel is formed in a portion of the first semiconductor 131 overlapping the gate electrode 155, and the channel is covered by the gate electrode 155, thereby not being doped. The gate electrode 155 is electrically connected to the expansion part 134 of the second semiconductor 132 through an opening (o) and first connecting members 192a, 192b, and 192c. Here, the first connecting members 192a, 192b, and 192c are disposed in the third conductive layer.

The input transistor T2 has a channel, a first area, and a second area in the second semiconductor 132 disposed on the first insulating layer 120, and the first area and the second area are doped to have a same or similar conductive characteristics as a conductor. The first area of the second semiconductor 132 is electrically connected to the data lines 171a, 171b, and 171c through the opening, the connecting parts 194 and 195, and the additional connecting parts Et2b and Et2c to receive the data voltages DVa, DVb, and DVc. The second area of the second semiconductor 132 may be connected directly to the expansion part 134 of which the area is widely extended, and is electrically connected to the gate electrode 155 of the driving transistor T1 through the expansion part 134. The second semiconductor 132 is covered by the second insulating layer 140, and the gate electrode 156 is disposed on the second insulating layer 140. In a plan view, a channel is formed in a portion of the second semiconductor 132 overlapping the gate electrode 156, and the channel is covered by the gate electrode 156, thereby not being doped. The gate electrode 156 is extended to be directly connected to the gate electrode of the initialization transistor T3, and is connected to the first scan line 151 through the opening and the connecting part 156e. In an embodiment, the gate electrode 156 is extended to be connected directly to the gate electrode of the input transistor T2 of the adjacent pixel and to the gate electrode of the initialization transistor T3.

The initialization transistor T3 has a channel, a first area, and a second area in the third semiconductor 133 disposed on the first insulating layer 120, and the first area and the second area are doped to have a same or similar conductive characteristics as a conductor. The first area of the third semiconductor 133 is electrically connected to the anodes 191a, 191b, and 191c disposed in the third conductive layer through the opening, and to the lower storage electrode 125 disposed in the first conductive layer. In an embodiment, the first area of the third semiconductor 133 is extended to be connected directly to the second area of the first semiconductor 131. The second area of the third semiconductor 133 is connected to the connecting part 173-1e of the first auxiliary initialization voltage line 173-1 through an opening and a connecting part 196 to receive the initialization voltage VINT. The third semiconductor 133 is covered by the second insulating layer 140, and the gate electrode 156 is formed on the second insulating layer 140. In a plan view, a channel is formed in the third semiconductor 133 overlapping the gate electrode 156, and the channel is covered by the gate electrode 156, thereby not being doped. The gate electrode 156 is extended to be connected directly to the gate electrode of the input transistor T2, and is connected to the first scan line 151 through the opening and the connecting part 156e. In an embodiment, the gate electrode 156 is extended to be connected directly to the gate electrode of the input transistor T2 of the adjacent pixel and to the gate electrode of the initialization transistor T3.

The storage capacitor Cst includes the lower storage electrode 125 disposed in the first conductive layer, the first insulating layer 120 disposed thereon, and the expansion part 134 of the second semiconductor 132 disposed on the semiconductor layer. Here, the expansion part 134 of the second semiconductor 132 is doped to have the same conductive characteristics as a conductor. The lower storage electrode 125 is electrically connected to the anodes 191a, 191b, and 191c disposed in the third conductive layer, the second area of the first semiconductor 131, and the first area of the third semiconductor 133 through the opening. In an embodiment, the expansion part 134 of the second semiconductor 132 is electrically connected to the gate electrode 155 of the driving transistor T1 through the opening, and is connected directly to the second area of the input transistor T2. The storage capacitor Cst may be formed in an area in which the lower storage electrode 125 and the expansion part 134 overlap each other in a plan view, and additionally, an additional storage capacitor Cst may be formed even in an area in which the gate electrode 155 of the driving transistor T1 and the lower storage electrode 125 overlap each other in a plan view.

The anodes 191a, 191b, and 191c are disposed or formed in the third conductive layer disposed on the third insulating layer 160. In an embodiment, the third insulating layer 160 may be an organic insulating film, but alternatively, an inorganic insulating film thickly formed to have a predetermined thickness or more may be used as the third insulating layer 160. The anodes 191a, 191b, and 191c include connecting parts that protrude to be connected to the driving transistor T1 and the initialization transistor T3. Sizes of the anodes 191a, 191b, and 191c may be variously changed according to efficiency of an emission layer, and shapes and dispositions thereof may also be variously changed, to be different from those shown in FIG. 2.

In an embodiment, openings 351a, 351b, and 351c are defined through the fourth insulating layer 350 disposed on the anodes 191a, 191b, and 191c has to expose respective anodes 191a, 191b, and 191c. An emission layer (not shown) is disposed on portions of the anodes 191a, 191b, and 191c exposed by the openings 351a, 351b, and 351c. In an embodiment, the emission layer may be disposed or formed only within the openings 351a, 351b, and 351c. In an embodiment, the emission layer (see 370 in FIG. 14) is formed on the exposed anodes 191a, 191b, and 191c and the fourth insulating layer 350. A cathode (not shown) is disposed or formed on the emission layer and the fourth insulating layer 350.

In FIG. 2 and FIG. 3, the connecting part (including the first connecting members 192a, 192b, and 192c) connecting the semiconductor layer and the plurality of conductive layers to each other is disposed in the third conductive layer. In an embodiment, the anodes 191a, 191b, and 191c are also disposed in the third conductive layer, the anodes 191a, 191b, and 191c of the adjacent pixels and the connecting part (including the first connecting members 192a, 192b, and 192c) may interfere with each other as the anodes 191a, 191b, and 191c of the adjacent pixels and the connecting part (including the first connecting members 192a, 192b, and 192c) are disposed to be close to each other. Particularly, the first connecting members 192a, 192b, and 192c among the connecting part are connected to the gate electrode 155 that controls the driving transistor T1, such that the driving transistor T1 may not be able to generate a target output current if the first connecting members 192a, 192b, and 192c interfere with the anodes 191a, 191b, 191c of the adjacent pixels. (see FIG. 17)

In an embodiment of the invention, as shown in FIG. 2 and FIG. 3, the second driving voltage line 172h for transmitting the driving voltage ELVDD and the second common voltage line 174h for transmitting the common voltage ELVSS are disposed in the third conductive layer, and the second driving voltage line 172h and the second common voltage line 174h extend in the first direction between the anodes 191a, 191b, and 191c of the adjacent pixels and the first connecting members 192a, 192b, and 192c. Therefore, in such an embodiment, the anodes 191a, 191b, and 191c of the adjacent pixels and the first connecting members 192a, 192b, and 192c do not interfere with each other.

In an embodiment, as shown in FIG. 2 and FIG. 3, the second driving voltage line 172h is disposed between the second anode 191b and the first connecting member 192c of the third pixel PXc. The second driving voltage line 172h, the second anode 191b, and the first connecting member 192c are all disposed in the third conductive layer, but the second anode 191b and the first connecting member 192c do not interfere with each other due to the second driving voltage line 172h to which the driving voltage ELVDD is constantly applied.

In such an embodiment, as shown in FIG. 2 and FIG. 3, the second common voltage line 174h is disposed between the first anode 191a and the first connecting member 192b of the second pixel PXb. The second common voltage line 174h, the first anode 191a, and the first connecting member 192b are all disposed in the third conductive layer, but the first anode 191a and the first connecting member 192b do not interfere with each other due to the second common voltage line 174h to which the common voltage ELVSS is constantly applied.

In an embodiment, as shown in FIG. 2 and FIG. 3, the second common voltage line 174h is disposed between the first pixel PXa and the second pixel PXb, that is, between the first anode 191a and the first connecting member 192b of the second pixel PXb. In an alternative embodiment, the second driving voltage line 172h may be disposed between the first pixel PXa and the second pixel PXb instead of the second common voltage line 174h.

In an embodiment, as shown in FIG. 2 and FIG. 3, the second driving voltage line 172h is disposed between the second pixel PXb and the third pixel PXc, that is, between the second anode 191b and the first connecting member 192c of the third pixel PXc. In an alternative embodiment, the second common voltage line 174h may be disposed between the second pixel PXb and the third pixel PXc instead of the second driving voltage line 172h.

Referring to FIG. 3, in an embodiment, the opening has a structure in which two conductive layers are exposed through one opening and are electrically connected to each other by one connecting part. In such an embodiment, at least one of the two conductive layers may have a structure in which a side surface thereof is exposed so that a connecting part and the side surface of the conductive layer directly contact each other. In such an embodiment, the expansion part 134 and the gate electrode 155 of the second semiconductor 132 are exposed by the opening (o), and a side surface of the gate electrode 155 is exposed. The first connecting members 192b and 192c may be disposed or formed on the upper surface of the exposed expansion part 134 and the side surface of the gate electrode 155 (of which upper surface may be included according to embodiments) to be electrically connected to each other. Such a connecting structure may be referred to as a side contact connecting method. According to this side contact connecting method, since it is possible to reduce the number of openings to be formed, an area occupied for connection may be reduced. In an embodiment, the side contact connecting method is used in various openings and connecting parts in addition to those shown in FIG. 3.

Hereinafter, manufacturing processes of the light emitting display device according to the embodiment of FIG. 2 and FIG. 3 will be described in detail with reference to FIG. 4 to FIG. 13.

FIG. 4 to FIG. 13 illustrate top plan views and cross-sectional views showing processes of a method of manufacturing a light emitting display device according to an embodiment.

Figure 4:
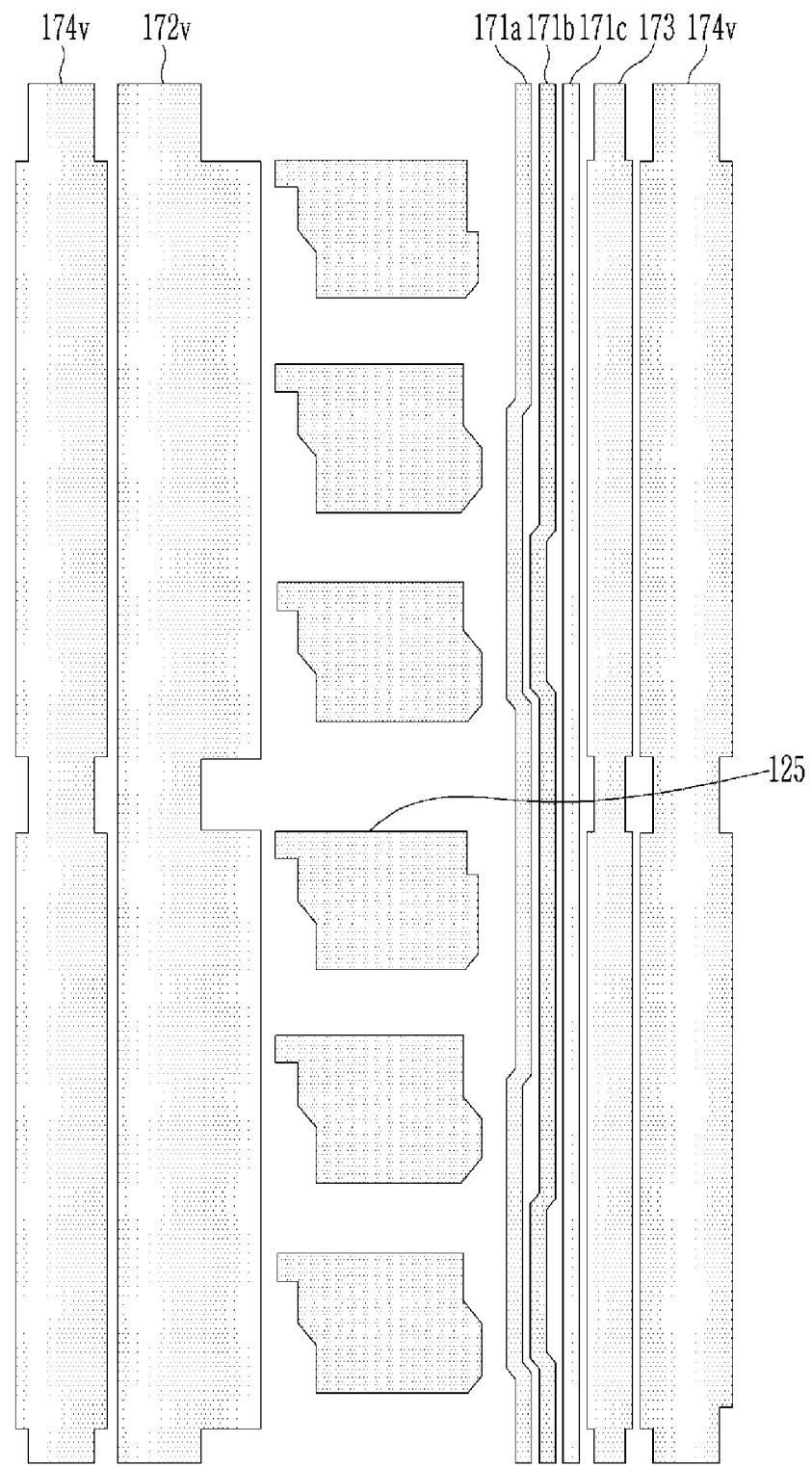
FIG. 4 to FIG. 13 illustrate top plan views and cross-sectional views showing processes of a method of manufacturing a light emitting display device according to an embodiment.
Figure 5:
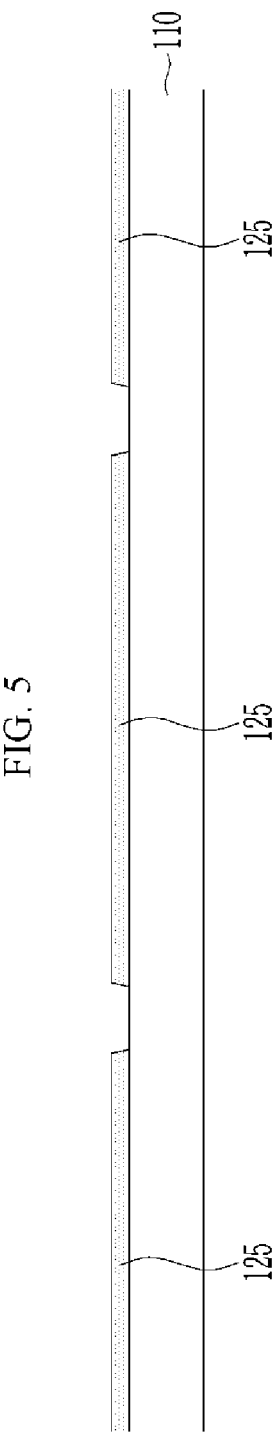

Referring to FIG. 4 and FIG. 5, in an embodiment, the data lines 171a, 171b, and 171c, the first driving voltage line 172v, the initialization voltage line 173, the first common voltage line 174v, and the lower storage electrode 125 are formed as or defined by the first conductive layers on the substrate 110. A first mask may be used for patterning to form the first conductive layer.

The data lines 171a, 171b, and 171c, the first driving voltage line 172v, the initialization voltage line 173, and the first common voltage line 174v are extended in the second direction (vertical direction). The lower storage electrode 125 has an island-like structure and is formed in plural, and one lower storage electrode 125 is formed per pixel PXa, PXb, or PXc. The data lines 171a, 171b, and 171c, the initialization voltage line 173, and the first common voltage line 174v are provided or disposed at the right side of the lower storage electrode 125, and the first driving voltage line 172v and the first common voltage line 174v are provided or disposed at the left side of the lower storage electrode 125. The first data line 171a, the second data line 171b, and the third data line 171c are provided or disposed to be adjacent to each other in the first direction (horizontal direction), and are electrically insulated from each other. The first common voltage line 174v is respectively provided or disposed at opposing sides of the pixels PXa, PXb, and PXc.

Figure 6:
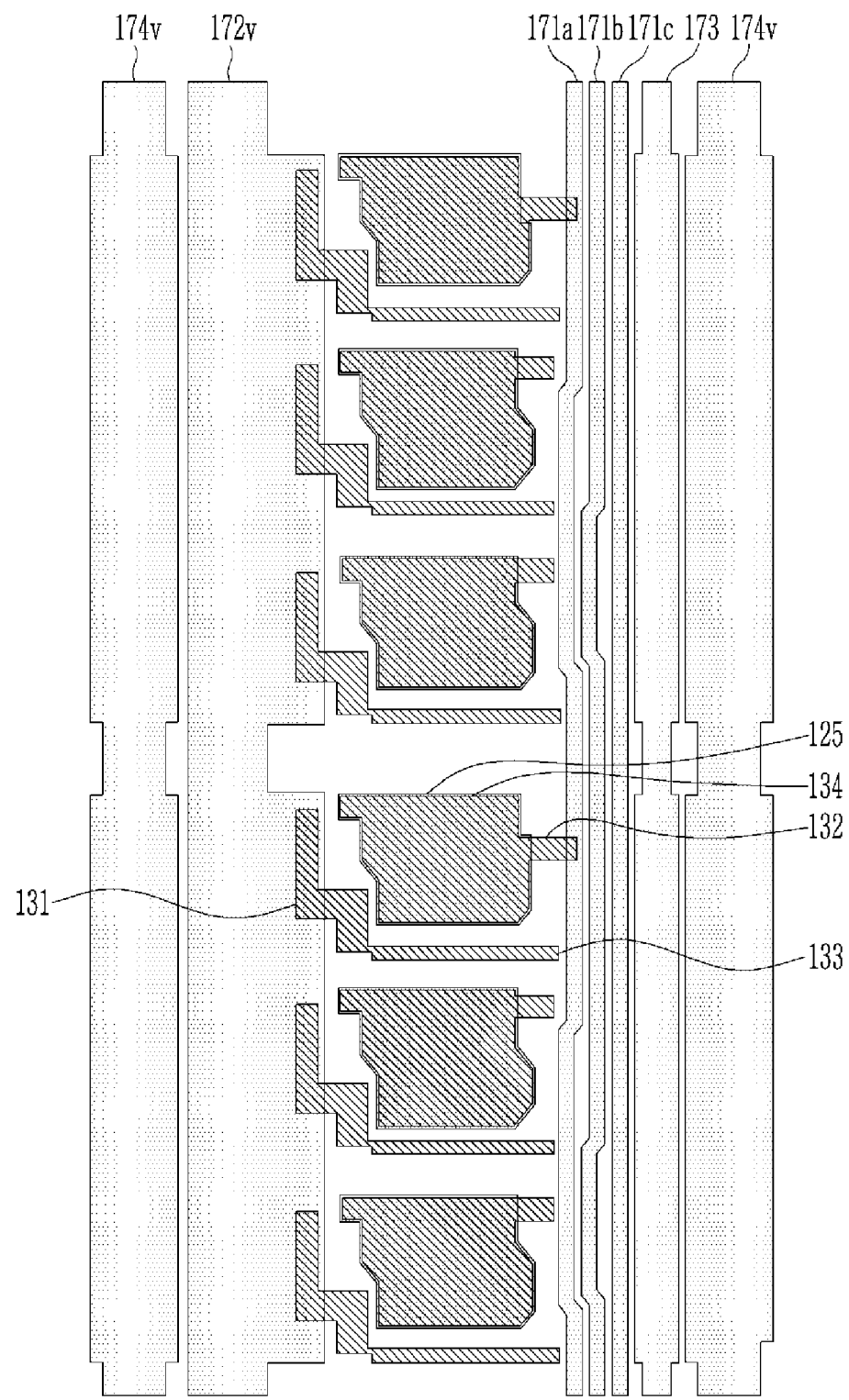
Figure 7:
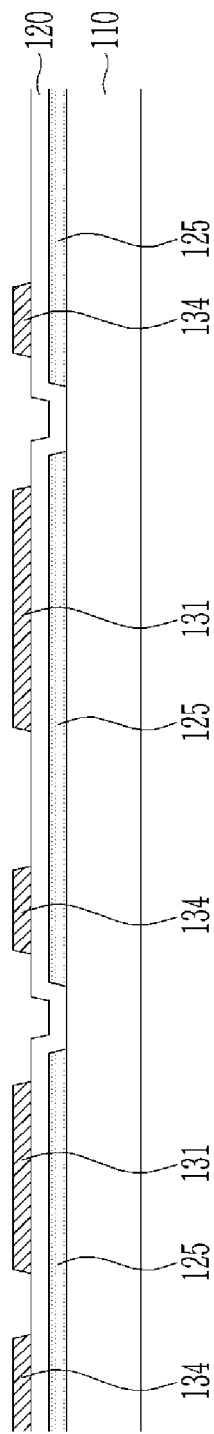

Referring to FIG. 6 and FIG. 7, the first insulating layer 120 is provided or formed on the first conductive layer, and the semiconductor layer is provided or formed on the first insulating layer 120. The semiconductor layer includes the first semiconductor 131, the second semiconductor 132, the third semiconductor 133, and the expansion part 134. The first semiconductor 131 and the third semiconductor 133 are integrally formed with each other as a single unitary unit, and the second semiconductor 132 and the expansion part 134 are integrally formed with each other as a single unitary unit. A second mask may be used to form the semiconductor layer.

Figure 8:
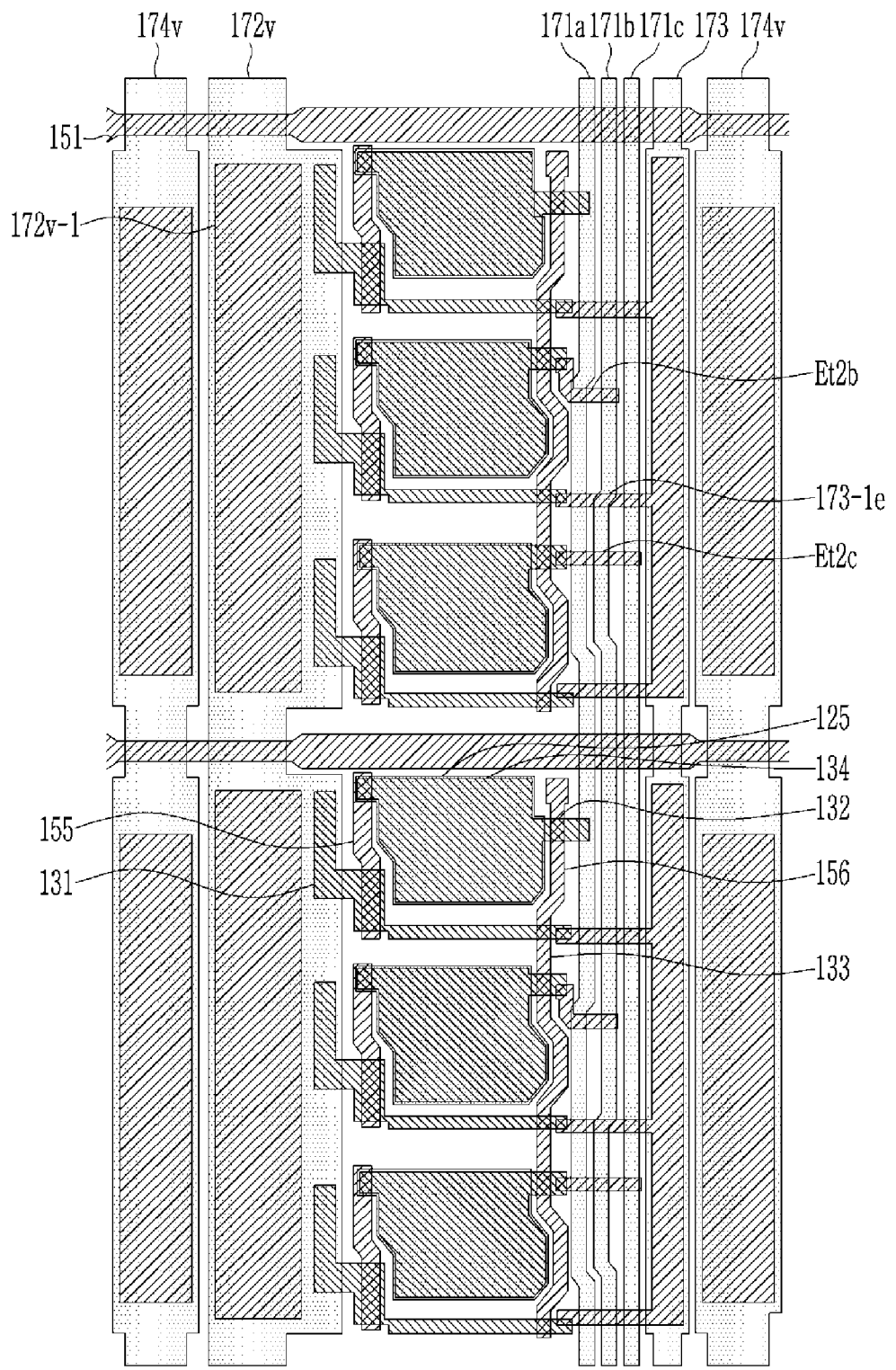
Figure 9:
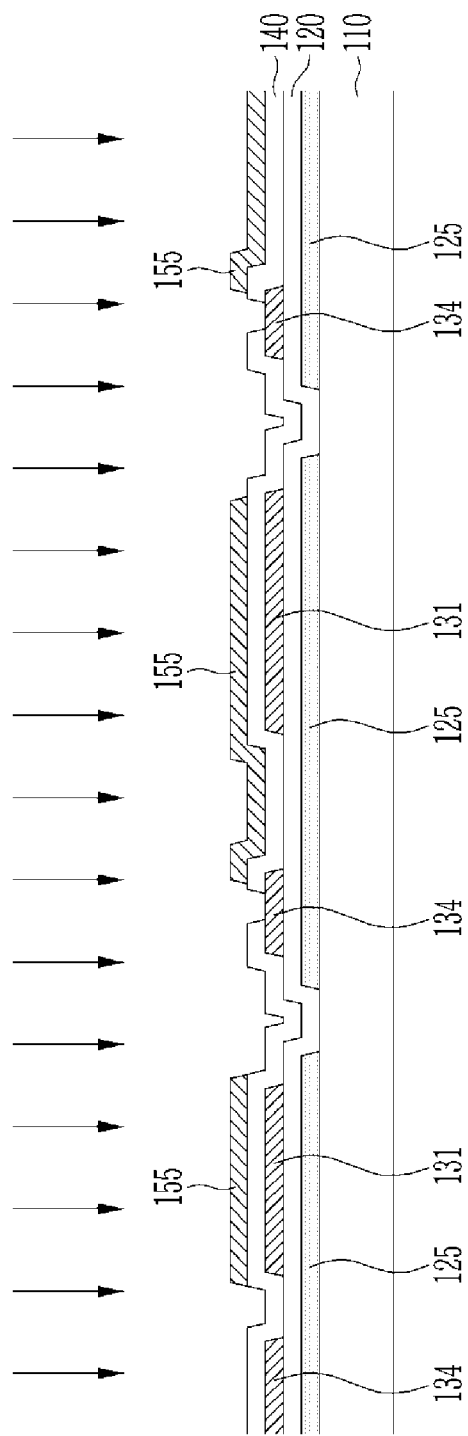

Referring to FIG. 8 and FIG. 9, the second insulating layer 140 is provided or formed on the semiconductor layer, and the second conductive layer is provided or formed on the second insulating layer 140. The second conductive layer includes the first scan line 151, the gate electrodes 155 and 156, the first auxiliary driving voltage line 172v-1, the first auxiliary initialization voltage line 173-1, the first auxiliary common voltage line 174v-1, and the additional connecting parts Et2b and Et2c. A third mask may be used to form the second conductive layer.

The first scan line 151 extends in the first direction (horizontal direction), and the gate electrodes 155 and 156, the first auxiliary driving voltage line 172v-1, the first auxiliary initialization voltage line 173-1, the first auxiliary common voltage line 174v-1, and the additional connecting parts Et2b and Et2c are formed between the adjacent first scan lines 151.

The gate electrodes 155 and 156 include the gate electrode 155 of the driving transistor T1 and the gate electrodes 156 of the input transistor T2 and the initialization transistor T3. The gate electrode 155 of the driving transistor T1 crosses the first semiconductor 131, and the gate electrodes 156 of the input transistor T2 and the initialization transistor T3 cross the second semiconductor 132 and the third semiconductor 133, respectively.

The first auxiliary driving voltage line 172v-1, the first auxiliary initialization voltage line 173-1, and the first auxiliary common voltage line 174v-1 are formed provided to extend in the second direction (vertical direction), and are electrically connected to the first driving voltage line 172v, the initialization voltage line 173, and the first common voltage line 174v that are disposed in the first conductive layer, respectively. In such an embodiment, the first auxiliary initialization voltage line 173-1 includes the connecting part 173-1e extending in the first direction (horizontal direction).

The additional connecting parts Et2b and Et2c serve to allow the second data line 171b and the third data line 171c to be connected to the second semiconductor 132. Among the three data lines 171a, 171b, and 171c, one data line 171a adjacent to the second semiconductor 132 is connected to the second semiconductor 132 without an additional connecting part, while the other two data lines 171b and 171c are connected to the second semiconductor 132 by using additional connecting parts Et2b and Et2c.

In FIG. 9, arrows indicate a doping process. In an embodiment, after the second conductive layer is provided or formed, a doping process is performed, so that the semiconductor layer covered by the second conductive layer is not doped, and a part of the semiconductor layer that is not covered by the second conductive layer is doped, thereby having a same or similar conductive properties as a conductor. In such an embodiment, the first semiconductor 131 is doped excluding a portion that overlaps the gate electrode 155, and the second semiconductor 132 and the third semiconductor 133 are doped excluding a portion that overlaps the gate electrode 156. In an embodiment, the expansion part 134 of the semiconductor layer is entirely doped to have a conductive characteristic identical to or similar to that of a conductor.

Figure 10:
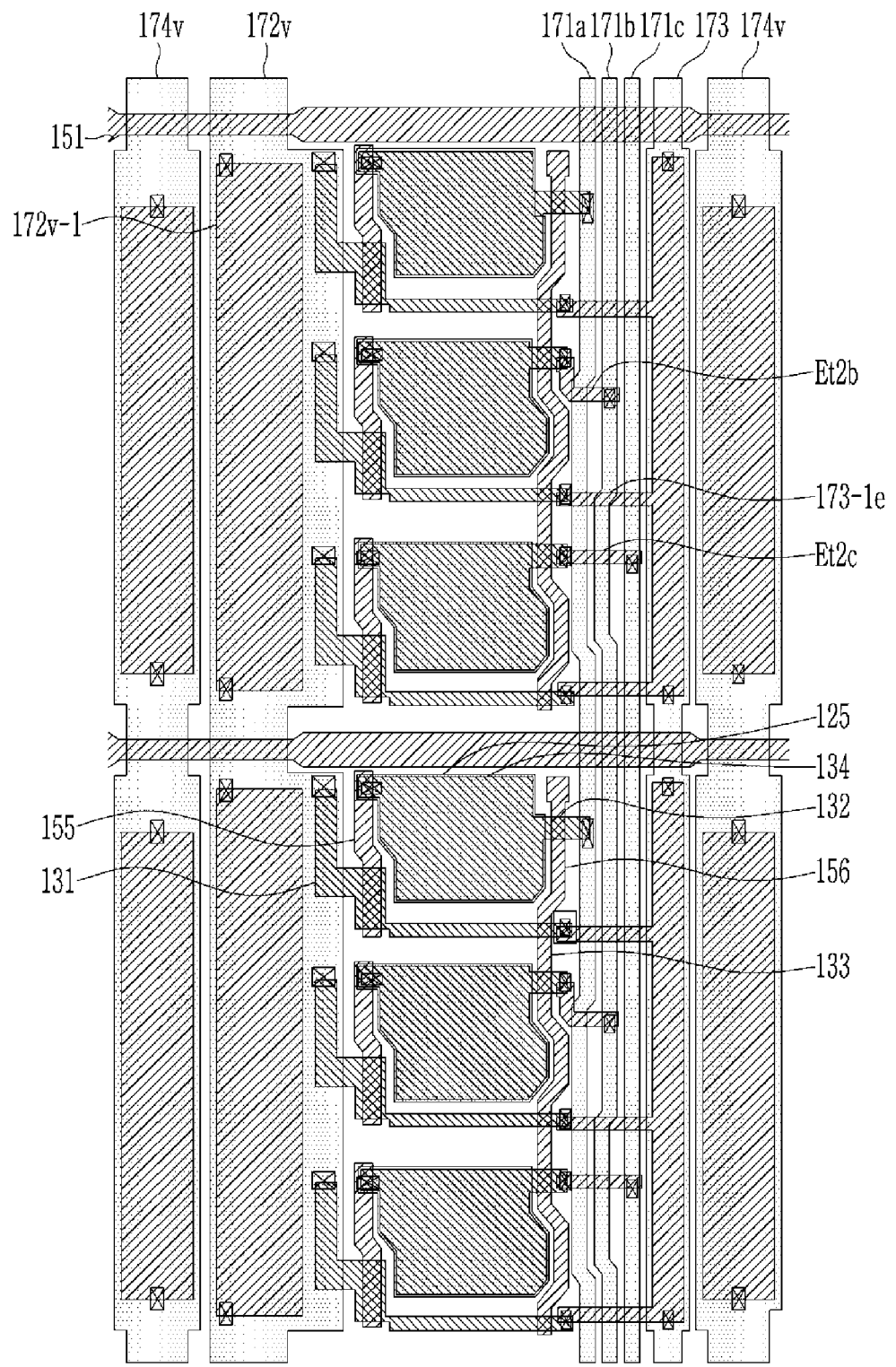
Figure 11:
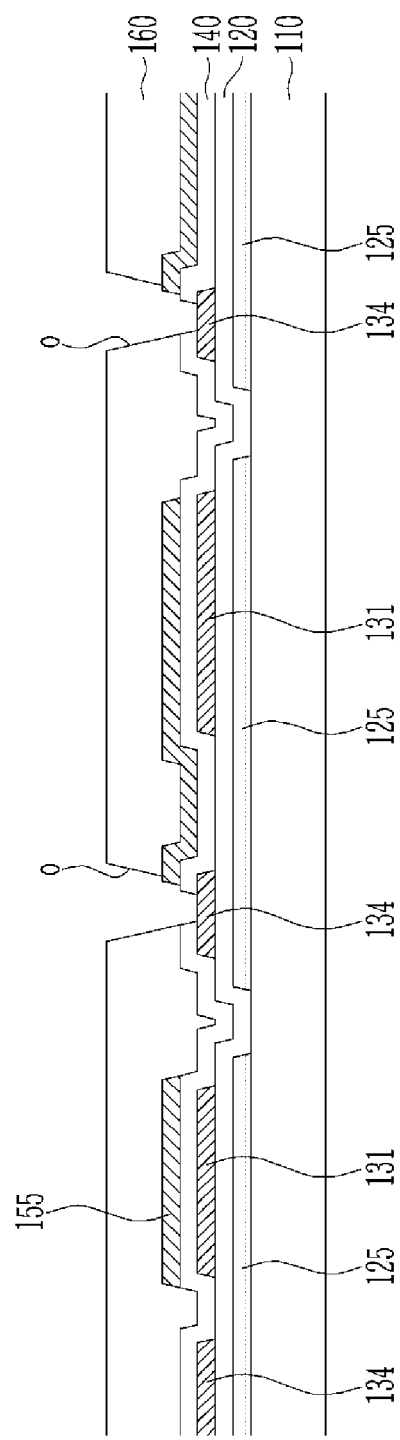

Referring to FIG. 10 and FIG. 11, the third insulating layer 160 is provided or formed on the second conductive layer, and the opening (o) is formed on the third insulating layer 160, so that the first conductive layer, the semiconductor layer, and the second conductive layer that are disposed therebelow are exposed. In such an embodiment, the opening (o) may expose the upper surface of the first conductive layer, the semiconductor layer, or the second conductive layer, and the side surface thereof may be exposed by the side surface of the first conductive layer, the semiconductor layer, or the second conductive layer that is partially exposed. A fourth mask may be used to form the opening (o) in the third insulating layer 160.

Figure 12:
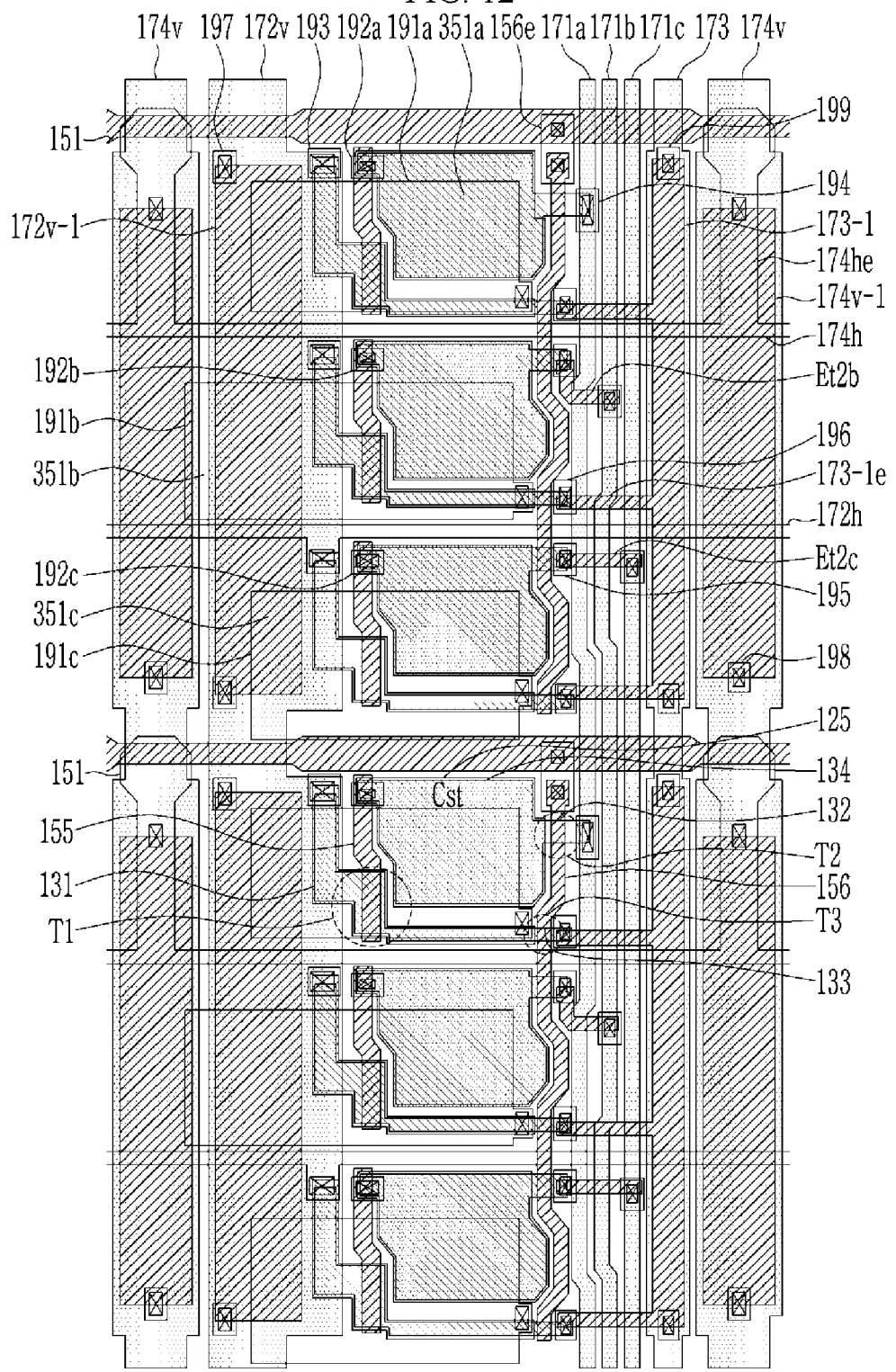
Figure 13:
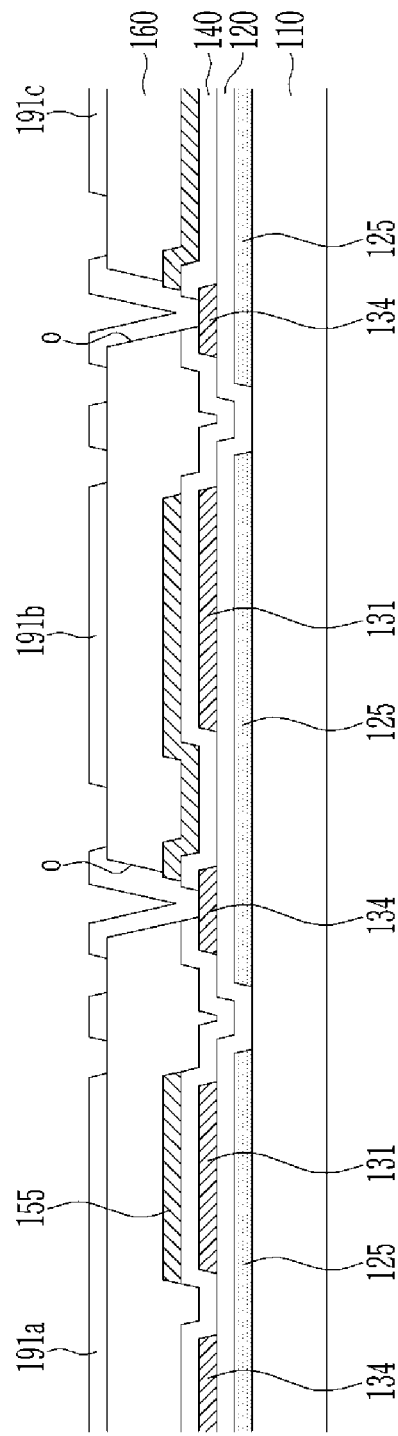

Referring to FIG. 12 and FIG. 13, the third conductive layer is provided or formed on the third insulating layer 160. The third conductive layer includes the anodes 191a, 191b, and 191c, the second driving voltage line 172h, the second common voltage line 174h, the first connecting members 192a, 192b, and 192c, and the various connecting parts 156e, 193, 194, 195, 196, 197, 198, and 199. A fifth mask may be used to form the third conductive layer.

The anodes 191a, 191b, and 191c are provided or formed in an island shape, and include connecting parts protruding to be connected to the driving transistor T1 and the initialization transistor T3, and may have various shapes and sizes.

The second driving voltage line 172h extends in the first direction (horizontal direction), and is integrally formed with the connecting part 193 as a single unitary unit to be electrically connected to the first driving voltage line 172v and the first semiconductor 131.

The second common voltage line 174h extends in the first direction (horizontal direction), and includes the connecting part 174he extending in the second direction. The connecting part 174he further includes the expansion part that is widely extended, and is electrically connected to the cathode through the expansion part.

The first connecting members 192a, 192b, and 192c electrically connect the gate electrode 155 and the expansion part 134 of the second semiconductor 132.

The connecting part 156e electrically connects the gate electrode 156 and the first scan line 151 to each other. The connecting part 193 electrically connects the first driving voltage line 172v and the first semiconductor 131 to each other, and a portion of the connecting part 193 may be integrally formed with the second driving voltage line 172h as a single unitary unit. The connecting parts 194, and 195 connect the data lines 171a, 171b, and 171c and the second semiconductor 132 to each other, e.g., via the additional connecting parts Et2b and Et2c. The connecting part 196 electrically connects the connecting part 173-1e of the first auxiliary initialization voltage line 173-1 and the third semiconductor 133 to each other. The connecting part 197 electrically connects the first auxiliary driving voltage line 172v-1 and the first driving voltage line 172v to each other, and the connecting part 198 electrically connects the first auxiliary common voltage line 174v-1 and the first common voltage line 174v to each other, while the connecting part 199 electrically connects the first auxiliary initialization voltage line 173-1 and the initialization voltage line 173 to each other.

Referring back to FIG. 2 and FIG. 3, the fourth insulating layer 350 is provided or formed in the third conductive layer. The fourth insulating layer 350 covers most of the third conductive layer, but the openings 351a, 351b, and 351c and the opening 352 that expose the anodes 191a, 191b, and 191c and the expansion part of the connecting part 174he, respectively, are formed in the fourth insulating layer 350. A sixth mask may be used to form the openings 351a, 351b, 351c, and 352 in the fourth insulating layer 350.

The opening 352 exposes the expansion part, which is a part of the connecting part 174he extending from the second common voltage line 174h, to be electrically connected to the cathode, so that the common voltage ELVSS may be applied to the cathode.

The emission layer and the cathode are provided or formed on the anodes 191a, 191b, and 191c and the fourth insulating layer 350 that are exposed by the openings 351a, 351b, and 351c, and the anodes 191a, 191b, and 191c, the emission layer, and the cathode form or collectively define the light emitting diodes EDa, EDb, and EDc. The emission layer and the cathode are entirely or commonly formed, so that a mask may not be used.

An encapsulation layer, a color conversion layer, or a color filter may be provided or formed on the light emitting diodes EDa, EDb, and EDc, and the structure thereof will hereinafter be described in detail with reference to FIG. 14.

Figure 14:
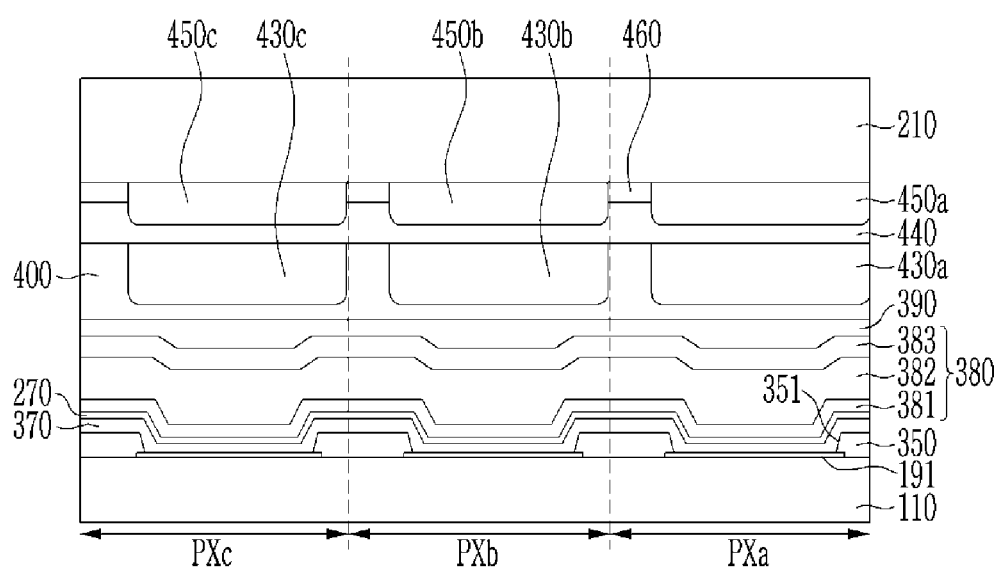
FIG. 14 illustrates a cross-sectional view of a light emitting display device according to an embodiment.

FIG. 14 illustrates a cross-sectional view of a light emitting display device according to an embodiment.

In FIG. 14, for convenience of illustration and description, the pixel circuit part of the constituent elements of the light emitting display device is omitted, and the remaining constituent elements including the anodes 191a, 191b, and 191c forming the light emitting diodes EDa, EDb, and EDc are schematically shown.

In an embodiment, fs shown in FIG. 14, the anode 191a, 191b, and 191c are provided or formed per respective pixels PXa, PXb, and PXc on the substrate 110. The structure of the pixel circuit part including the plurality of transistors and the insulating layers disposed between the substrate 110 and the anodes 191a, 191b, and 191c is omitted, but these elements may be provided, for example, as shown in FIG. 1 to FIG. 3.

The fourth insulating layer 350 is disposed on the anodes 191a, 191b, and 191c, and the opening 351 is defined through the fourth insulating layer 350 to expose a portion of the anodes 191a, 191b, or 191c.

The emission layer 370 may be disposed on the anodes 191a, 191b, and 191c and the fourth insulating layer 350. In an embodiment, the emission layer 370 is disposed on the entire area. In such an embodiment, the emission layer 370 may be an emission layer that emits first color light that may be blue light. In an alternative embodiment, the emission layers 370 may be formed to be separated from each other around the opening 351 of each pixel, and in such an embodiment, the emission layer of each pixel may emit light of a different color. The cathode 270 may be entirely or commonly disposed on the emission layer 370.

An encapsulation layer 380 including a plurality of insulating layers 381, 382, and 383 may be disposed on the cathode 270. The insulating layer 381 and the insulating layer 383 may include an inorganic insulating material, and the insulating layer 382 disposed between the insulating layer 381 and the insulating layer 383 may include an organic insulating material.

A filling layer 390 including a filler may be disposed on the encapsulation layer 380. A cover layer 400 including an insulating material, a plurality of color conversion layers 430a and 430b, and a transmissive layer 430c may be disposed on the filling layer 390.

The transmissive layer 430c may transmit incident light. In an embodiment, the transmissive layer 430c may transmit first color light, which may be blue light. The transmissive layer 430c may include a polymer material that transmits the first color light. An area in which the transmissive layer 430c is disposed may correspond to a light emitting area that emits blue light, and the transmissive layer 430c may transmit the incident first color light as it is without including a separate semiconductor nanocrystal.

The color conversion layers 430a and 430b may include different semiconductor nanocrystals from each other. In one embodiment, for example, the first color light incident on the color conversion layer 430a may be converted into second color light by the semiconductor nanocrystal included in the color conversion layer 430b to be emitted. In such an embodiment, the first color light incident on the color conversion layer 430b may be converted into third color light by the semiconductor nanocrystal included in the color conversion layer 430*b* to be emitted.

The semiconductor nanocrystal may include at least one selected from phosphor and quantum dot materials that convert the incident first color light into the second color light or the third color light.

A core of the quantum dot may be selected from a group II-VI compound, a group III-V compound, a group IV-VI compound, a group IV element, a group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In an embodiment, the two-element compound, the three-element compound, or the four-element compound may be present in particles at uniform concentrations, or they may be divided into states having partially different concentrations to be present in a same particle, respectively. In an embodiment, a core/shell structure in which some quantum dots enclose some other quantum dots may be possible. An interface between the core and the shell may have a concentration gradient in which a concentration of elements of the shell decreases closer to its center.

In an embodiment, the quantum dot may have a core-shell structure that includes a core including the nanocrystal described above and a shell surrounding the core. The shell of the quantum dot may serve as a passivation layer for maintaining a semiconductor characteristic and/or as a charging layer for applying an electrophoretic characteristic to the quantum dot by preventing chemical denaturation of the core. The shell may be a single layer or a multilayer. An interface between the core and the shell may have a concentration gradient in which a concentration of elements of the shell decreases closer to its center. In an embodiment, the shell of the quantum dot includes a metal or nonmetal oxide, a semiconductor compound, or a combination thereof, for example.

In one embodiment, for example, the metal or nonmetal oxide may be a two-element compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, and the like, or a three-element compound such as $MgAl_2O_4$, $CoFe_2O_4$, $NiFe_2O_4$, $CoMn_2O_4$, and the like, but the invention is not limited thereto.

In an embodiment, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the invention is not limited thereto.

The quantum dot may have a full width at half maximum ("FWHM") of the light-emitting wavelength spectrum that is equal to or less than about 45 nanometers (nm), e.g., equal to or less than about 40 nm, e.g., equal to or less than about 30 nm, such that color purity or color reproducibility may be improved. In an embodiment, since light emitted through the quantum dot is emitted in all directions, a viewing angle of light may be improved.

In an embodiment, a shape of the quantum dot is not particularly limited to a shape generally used in the art, and may be a spherical, pyramidal, multi-armed, or cubic nanoparticle, nanotube, nano-wire, nano-fiber, nano-plate particle shape, and the like.

The quantum dot may control a color of emitted light according to a particle size thereof, and thus the quantum dot may have various light emitting colors such as blue, red, and green colors.

An insulating layer 440 may be disposed on the plurality of color conversion layers 430*a* and 430*b* and the transmissive layer 430*c*, and a plurality of color filters 450*a*, 450*b*, and 450*c* and a light blocking member 460 may be disposed thereon.

The color filter 450*a* may display the second color light, the color filter 450*b* may display the third color light, and the color filter 450*c* may display the first color light.

The light blocking member 460 may be disposed between adjacent color filters 450*a*, 450*b*, and 450*c*.

A substrate (or a second or upper substrate) 210 may be disposed on the plurality of color filters 450*a*, 450*b*, and 450*c* and the light blocking member 460. In an embodiment, a plurality of color conversion layers 430*a* and 430*b* and a plurality of color filters 450*a*, 450*b*, and 450*c* may be disposed between the substrate 110 and the substrate 210.

According to an alternative embodiment, the emission layer 370 may include quantum dots instead of including the plurality of color conversion layers 430*a* and 430*b* and the transmissive layer 430*c*.

The substrates 110 and 210 may include or be made of a same material as each other. The layer that is formed on the substrate 110 is formed up to the encapsulation layer 380. In such an embodiment, the color filters 450*a*, 450*b*, and 450*c*, the light blocking member 460, the insulating layer 440, the color conversion layers 430*a* and 430*b*, the transmissive layer 430*c*, and the cover layer 400 are formed on the substrate 210. Thereafter, the light emitting display device may be formed by attaching the upper and lower substrate structures 110 and 210 to each other by using the filling layer 390. In such an embodiment, a sealant is further included in an outer or inner side of the filling layer 390, so that the upper and lower substrate structures may be attached.

FIG. 2 illustrates an embodiment in which the second common voltage line 174*h* and the second driving voltage line 172*h* are formed as or defined by the third conductive layer between the three pixels PXa, PXb, and PXc to reduce interference between adjacent pixels.

In an alternative embodiment, only one of the second common voltage line 174*h* and the second driving voltage line 172*h* may be formed as or defined by the third conductive layer.

Such an embodiment will be described in detail with reference to FIG. 15 and FIG. 16.

Figure 15:
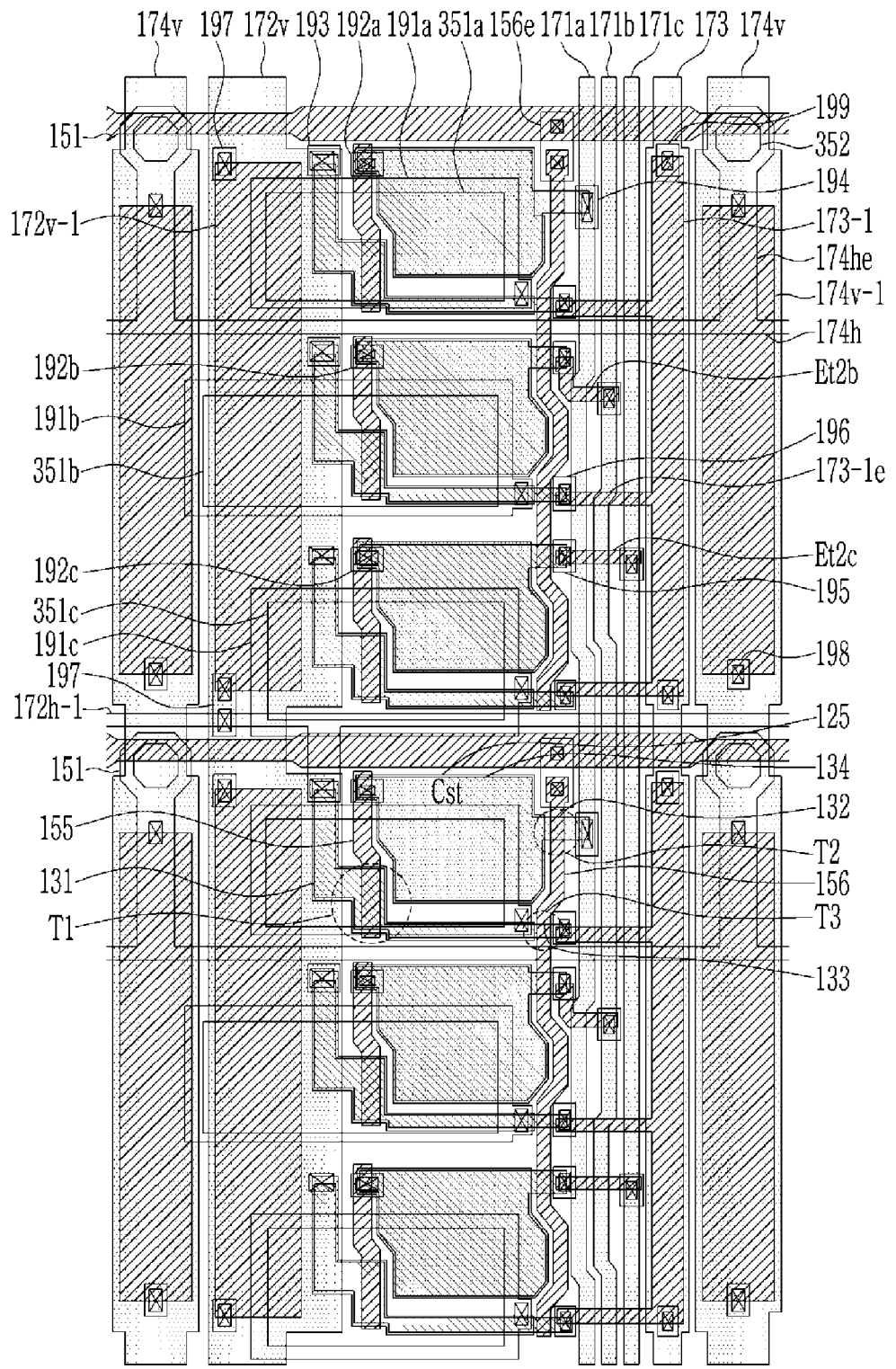
FIG. 15 and FIG. 16 illustrate top plan views of a portion of a light emitting display device according to alternative embodiments.
Figure 16:
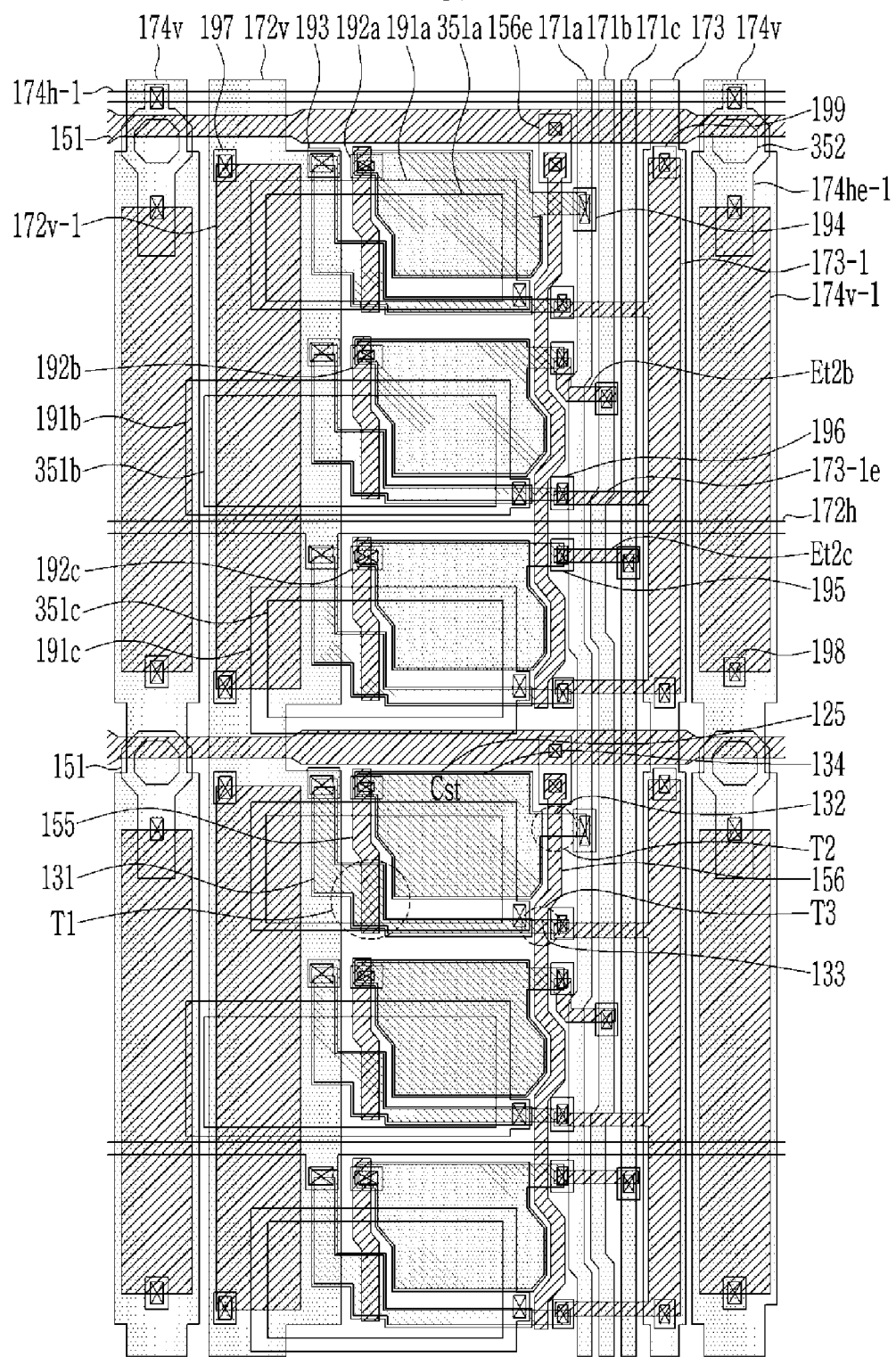

FIG. 15 and FIG. 16 illustrate top plan views of a portion of a light emitting display device according to alternative embodiments.

In an embodiment, referring to FIG. 15, only the second common voltage line 174*h* is disposed in the third conductive layer, and the second driving voltage line 172*h* is omitted. In such an embodiment, an additional driving voltage line 172*h*-1 is included in the second conductive layer corresponding to the second driving voltage line 172*h*.

According to an embodiment, as shown in FIG. 15, the driving voltage line 172 that transmits the driving voltage ELVDD includes the first driving voltage line 172*v*, the first auxiliary driving voltage line 172*v*-1, and the additional driving voltage line 172*h*-1. The first driving voltage line 172*v* is disposed in the first conductive layer, and extends in the second direction (vertical direction). The first auxiliary driving voltage line 172*v*-1 is disposed in the second conductive layer, and a plurality of first auxiliary driving voltage lines 172*v*-1 are formed long in the second direction. In such an embodiment, the additional driving voltage line 172*h*-1 is also disposed in the second conductive layer, and extends in the first direction (horizontal direction). The first driving voltage line 172*v*, the first auxiliary driving voltage line 172*v*-1, and the additional driving voltage line 172*h*-1 are electrically connected through the connecting part 197 and the opening. As a result, the driving voltage ELVDD is not only transmitted through the double layer (the first driving voltage line 172*v* and the first auxiliary driving voltage line 172*v*-1), but is also transmitted in the horizontal direction by the additional driving voltage line 172*h*-1, so that the voltage level of the driving voltage ELVDD is made constant throughout the light emitting display device.

In an embodiment of FIG. 15, the second common voltage line 174*h* is disposed in the third conductive layer. Since the second common voltage line 174*h* is disposed between the first pixel PXa and the second pixel PXb, that is, between the first anode 191*a* and the first connecting member 192*b* of the second pixel PXb, interference between the first anode 191*a* and the first connecting member 192*b* of the second pixel PXb may be reduced. In an embodiment of FIG. 15, as compared with the embodiment of FIG. 2, interference between the second anode 191*b* and the first connecting member 192*c* of the third pixel PXc may not be reduced. In such an embodiment, a horizontal distance between the second anode 191*b* and the first connecting member 192*c* of the third pixel PXc may be sufficiently secured, such that only the second common voltage line 174*h* may be disposed in the third conductive layer, as shown in FIG. 15.

In another alternative embodiment, referring to FIG. 16, only the second driving voltage line 172*h* is disposed in the third conductive layer, and the second common voltage line 174*h* is omitted. However, an additional common voltage line 174*h*-1 is included in the second conductive layer corresponding to the second common voltage line 174*h*.

According to an embodiment of FIG. 16, the common voltage line 174 transmitting the common voltage ELVSS includes the first common voltage line 174*v*, the first auxiliary common voltage line 174*v*-1, and the additional common voltage line 174*h*-1. The first common voltage line 174*v* is disposed in the first conductive layer, and extends in the second direction (vertical direction). The first auxiliary common voltage line 174*v*-1 is disposed in the second conductive layer, and a plurality of first auxiliary common voltage lines 174*v*-1 are formed long in the second direction. In such an embodiment, the additional common voltage line 174*h*-1 is also disposed in the second conductive layer, and extends in the first direction (horizontal direction). The first common voltage line 174*v*, the first auxiliary common voltage line 174*v*-1, and the additional common voltage line 174*h*-1 are electrically connected through the connecting part 198, the additional connecting part 174*he*-1, and the opening. In such an embodiment, the connecting part 198 and the additional connecting part 174*he*-1 are disposed in the third conductive layer, and the additional connecting part 174*he*-1 further includes an expansion part. The common voltage ELVSS is not only transmitted through the double layer (the first common voltage line 174*v* and the first auxiliary common voltage line 174*v*-1), but is also transmitted in the horizontal direction by the additional common voltage line 174*h*-1, so that the voltage level of the driving voltage ELVDD is maintained constant throughout the light emitting display device. In such an embodiment, the common voltage ELVSS may be transmitted to the cathode through the expansion part of the additional connecting part 174*he*-1.

In an embodiment of FIG. 16, the second driving voltage line 172*h* is disposed in the third conductive layer. Since the second driving voltage line 172*h* is disposed between the second pixel PXb and the third pixel PXc, that is, between the second anode 191*b* and the first connecting member 192*c* of the third pixel PXc, interference between the second anode 191*b* and the first connecting member 192*c* of the third pixel PXc may be reduced. However, in such an embodiment of FIG. 16, as compared with the embodiment of FIG. 2, interference between the first anode 191*a* and the first connecting member 192*b* of the second pixel PXb may not be reduced. However, in such an embodiment a horizontal distance between the first anode 191*a* and the first connecting member 192*b* of the second pixel PXb may be sufficiently secured, such that only the second driving voltage line 172*h* may be formed in the third conductive layer as shown in FIG. 16.

Hereinafter, a comparative example in which the second driving voltage line 172*h* and the second common voltage line 174*h* are not formed in the third conductive layer will be compared with an embodiment of the invention with reference to FIG. 17.

Figure 17:
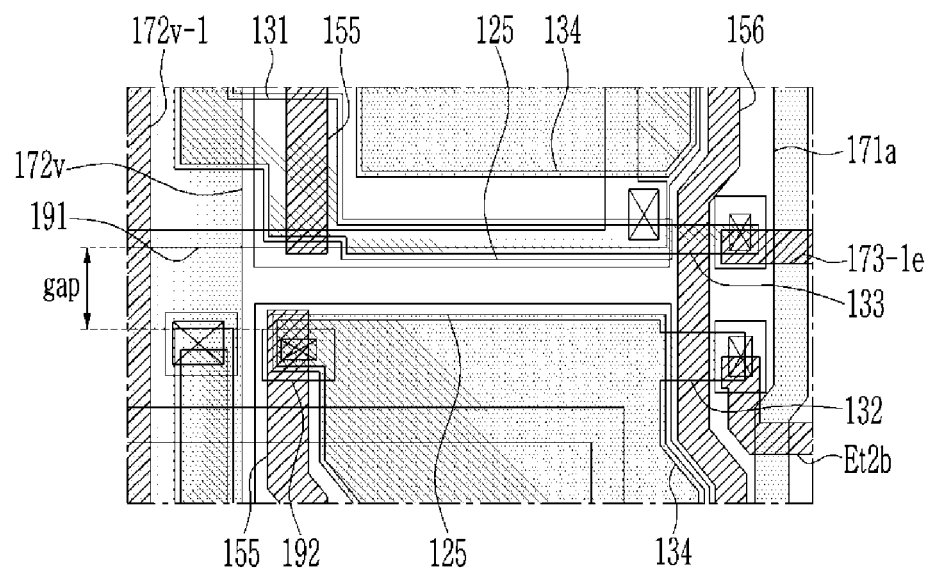
FIG. 17 illustrates an enlarged top plan view of a portion of a pixel of a light emitting display device according to a comparative example.

FIG. 17 illustrates an enlarged top plan view of a portion of a pixel of a light emitting display device according to a comparative example.

FIG. 17 illustrates an embodiment in which no portion of the third conductive layer is disposed between the anode 191 of the adjacent pixel and the first connecting member 192 of the present pixel. In the comparative example, both the anode 191 of the adjacent pixel and the first connecting member 192 of the present pixel are formed with or defined by the third conductive layer, so that they are separated by only a horizontal distance (gap) as shown in FIG. 17. As a result, a change in voltage level of the anode 191 of the adjacent pixel affects the first connecting member 192 of the present pixel, and vice versa. All pixels are charged to the gate electrode 155 of the driving transistor T1 and the expansion part 134 of the semiconductor layer at different voltage levels to display an image. However, when the change and interference in voltage level of the anode 191 of the adjacent pixel occur, the gate electrode 155 of the driving transistor T1 of the present pixel and the expansion part 134 of the semiconductor layer may not be charged up to a target voltage. In this case, the light emitting diode of the present pixel may not display the target luminance.

However, as in an embodiment of the invention, as described above, the voltage line (the second common voltage line 174*h* or the second driving voltage line 172*h* in the embodiments of FIG. 2, FIG. 15, and FIG. 16) is formed with or defined by a portion of the third conductive layer between the anode 191 of the adjacent pixel and the first connecting member 192 of the present pixel, the interference between the anode 191 of the adjacent pixel and the first connecting member 192 of the present pixel rapidly decreases. As a result, the target voltage is charged to the gate electrode 155 of the driving transistor T1 and the expansion part 134 of the semiconductor layer, and the light emitting diode of each pixel displays the target luminance, thereby improving display quality.

Hereinafter, an alternative embodiment will be described with reference to FIG. 18.

Figure 18:
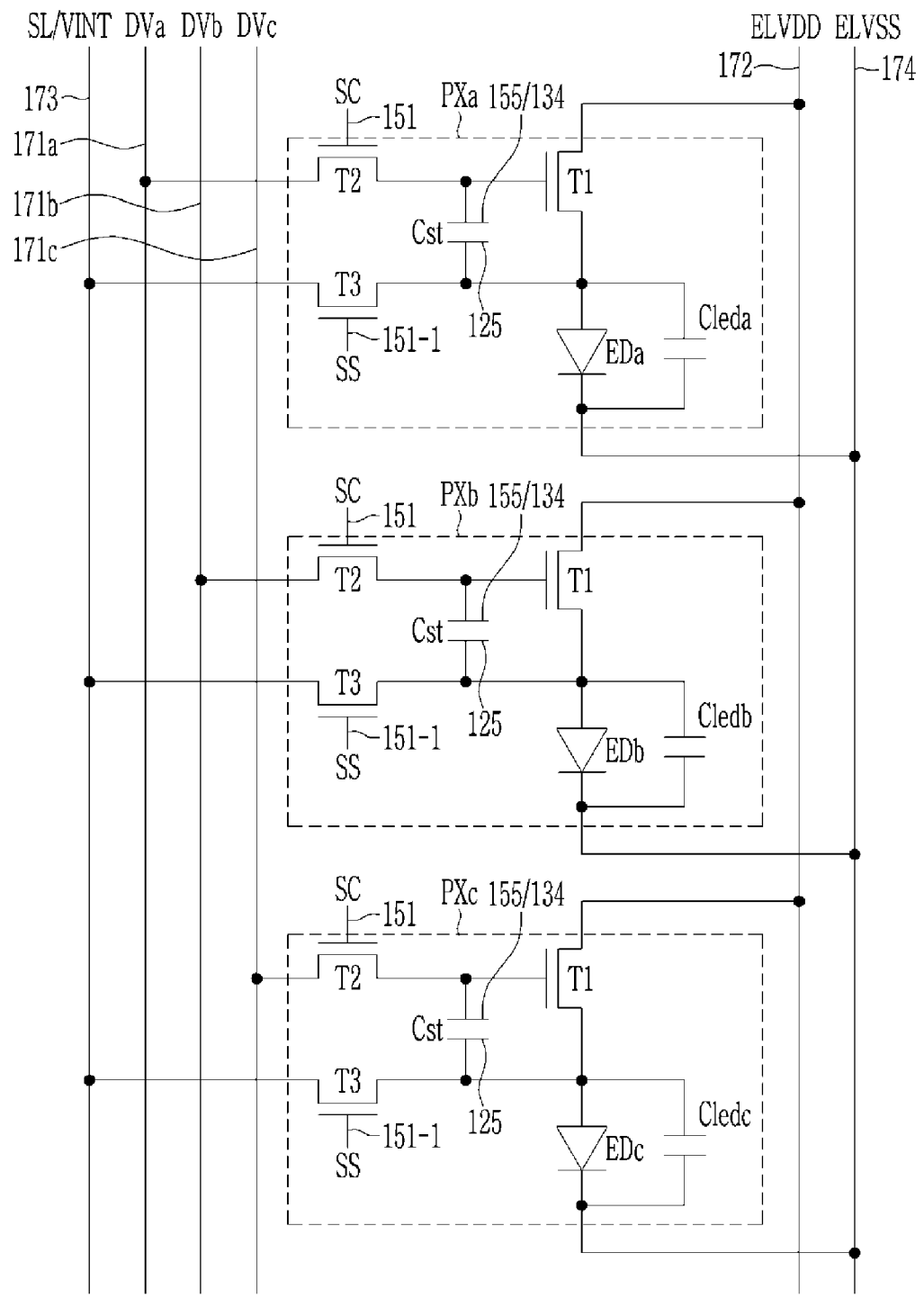
FIG. 18 illustrates a circuit diagram of a pixel of a light emitting display device according to an alternative embodiment.

FIG. 18 illustrates a circuit diagram of a pixel of a light emitting display device according to another embodiment.

Compared with FIG. 1, FIG. 18 illustrates an embodiment in which the gate electrode of the initialization transistor T3 receives a different scan signal from that of the input transistor T2.

Hereinafter, for convenience of description, features of the embodiment of FIG. 18 that are different from those of the embodiment of FIG. 1 will be mainly described.

The gate electrode of the initialization transistor T3 of each of the pixels PXa, PXb, and PXc is connected to a second scan line 151-1 for transmitting a second scan signal SS. The first electrode of the initialization transistor T3 is connected to the other end of the storage capacitor Cst, the second electrode of the driving transistor T1, and the anode of the light emitting diode EDa, EDb, or EDc, and the second electrode of the initialization transistor T3 is connected to the initialization voltage line that transmits the initialization voltage VINT. The initialization transistor T3 is turned on in response to the second scan signal SS to transmit the initialization voltage VINT to the anode of the light emitting diode EDa, EDb, or EDc and the other end of the storage capacitor Cst to initialize the voltage of the anode of the light emitting diode EDa, EDb, or EDc. In an embodiment, before the initialization voltage VINT is transmitted to the anode of the light emitting diode EDa, EDb, or EDc, it is possible to sense whether the target voltage of the previous frame is maintained by sensing the voltage of the anode of the light emitting diode EDa, EDb, or EDc.

In an embodiment of FIG. 18, turn-on periods of the initialization transistor T3 and of the input transistor T2 may be separated, so that a writing operation performed by the input transistor T2 and a sensing operation and/or initialization operation performed by the initialization transistor T3 may be performed at different timings from each other.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A light emitting display device comprising:
a first driving transistor;
a first anode electrically connected to the first driving transistor;
a first capacitor electrically connected to a gate electrode of the first driving transistor;
a second driving transistor disposed to be adjacent to the first driving transistor;
a second anode electrically connected to the second driving transistor;
a second capacitor electrically connected to a gate electrode of the second driving transistor;
a driving voltage line which applies a driving voltage to the first driving transistor and the second driving transistor; and
a first connecting member electrically connecting the gate electrode of the first driving transistor and the first capacitor,
wherein the driving voltage line is disposed between the first connecting member and the second anode in a plan view.

2. The light emitting display device of claim 1, wherein the first connecting member, the first anode, and the driving voltage line do not overlap each other in the plan view.

3. The light emitting display device of claim 2, wherein each of the first capacitor and the second capacitor includes:
a lower storage electrode disposed in a first conductive layer disposed on a substrate;
a first insulating layer disposed on the lower storage electrode; and
an expansion part disposed in a semiconductor layer disposed on the first insulating layer.

4. The light emitting display device of claim 3, wherein each of the first driving transistor and the second driving transistor includes:
a first semiconductor disposed in the semiconductor layer;
a second insulating layer disposed on the semiconductor layer; and
a gate electrode disposed in a second conductive layer disposed on the second insulating layer.

5. The light emitting display device of claim 4, wherein a third insulating layer is disposed on the second conductive layer,
a third conductive layer is disposed on the third insulating layer, and
the first connecting member, the first anode, and the driving voltage line are disposed in the third conductive layer.

6. The light emitting display device of claim 5, wherein the driving voltage line is a second driving voltage line extending in a first direction,
wherein the light emitting display device further comprises a first driving voltage line which is electrically connected to the second driving voltage line and extends in a second direction perpendicular to the first direction.

7. The light emitting display device of claim 6, further comprising
a connecting part which connects the second driving voltage line and the first driving voltage line to each other and is disposed in the third conductive layer,
wherein the connecting part is connected to a semiconductor of the driving transistor, and the connecting part is integrally formed with the second driving voltage line as a single unitary unit.

8. The light emitting display device of claim 6, wherein the first driving voltage line is disposed in the first conductive layer,
wherein the light emitting display device further comprises a first auxiliary driving voltage line which is electrically connected to the first driving voltage line and extends along the first driving voltage line.

9. The light emitting display device of claim 6, further comprising:
a first input transistor which transmits a data voltage to the gate electrode of the first driving transistor; and
a first initialization transistor which transmits an initialization voltage to the first anode,
wherein the first anode is electrically connected to the lower storage electrode and the first initialization transistor.

10. The light emitting display device of claim 2, further comprising:
a third driving transistor disposed to be adjacent to the second driving transistor;
a third anode electrically connected to the third driving transistor;
a third capacitor electrically connected to a gate electrode of the third driving transistor;
a cathode which collectively define a light emitting diode with the first anode, the second anode, and the third anode;
a common voltage line which transmits a common voltage to the cathode; and
a second connecting member electrically connecting the gate electrode of the second driving transistor and the second capacitor,
wherein the common voltage line is disposed between the second connecting member and the third anode in the plan view.

11. The light emitting display device of claim 10, wherein the second connecting member, the third anode, and the common voltage line do not overlap each other in the plan view.

12. A light emitting display device comprising:
a first driving transistor;
a first anode electrically connected to the first driving transistor;
a first capacitor electrically connected to a gate electrode of the first driving transistor;
a second driving transistor disposed to be adjacent to the first driving transistor;
a second anode electrically connected to the second driving transistor;
a second capacitor electrically connected to a gate electrode of the second driving transistor;
a cathode which collectively define a light emitting diode with the first anode and the second anode;
a common voltage line which transmits a common voltage to the cathode; and
a first connecting member electrically connecting the gate electrode of the first driving transistor and the first capacitor,
wherein the common voltage line is disposed between the first connecting member and the second anode in a plan view.

13. The light emitting display device of claim 12, wherein the first connecting member, the first anode, and the common voltage line do not overlap each other in the plan view.

14. The light emitting display device of claim 13, wherein each of the first capacitor and the second capacitor includes:
a lower storage electrode disposed in a first conductive layer disposed on a substrate;
a first insulating layer disposed on the lower storage electrode; and
an expansion part disposed in a semiconductor layer disposed on the first insulating layer.

15. The light emitting display device of claim 14, wherein each of the first driving transistor and the second driving transistor includes:
a first semiconductor disposed in the semiconductor layer;
a second insulating layer disposed on the semiconductor layer; and
a gate electrode disposed in a second conductive layer disposed on the second insulating layer.

16. The light emitting display device of claim 15, wherein a third insulating layer is disposed on the second conductive layer,
a third conductive layer is disposed on the third insulating layer, and
the first connecting member, the first anode, and the common voltage line are disposed in the third conductive layer.

17. The light emitting display device of claim 16, wherein the common voltage line is a second common voltage line extending in a first direction, and
wherein the light emitting display device further comprises a first common voltage line which is electrically connected to the second common voltage line and extends in a second direction perpendicular to the first direction.

18. The light emitting display device of claim 17, wherein the first common voltage line is disposed in the first conductive layer, and
wherein the light emitting display device further comprises a first auxiliary common voltage line which is electrically connected to the first common voltage line and extends along the first common voltage line.

19. The light emitting display device of claim 17, wherein the second common voltage line further includes a connecting part extending in the second direction,
an expansion part is defined by a widely extended end portion of the connecting part widely extended, and
the second common voltage line is electrically connected to the cathode through the expansion part.

20. The light emitting display device of claim 17, further comprising:
a first input transistor which transmits a data voltage to the gate electrode of the first driving transistor; and
a first initialization transistor which transmits an initialization voltage to the first anode,
wherein the first anode is electrically connected to the lower storage electrode and the first initialization transistor.

* * * * *